(12) United States Patent
   Gupta

(10) Patent No.: US 11,251,593 B2
(45) Date of Patent: Feb. 15, 2022

(54) MINIMAL TOUCH POST FOR MULTI-LAYER CABLE ROUTING

(71) Applicant: Cisco Technology, Inc., San Jose, CA (US)

(72) Inventor: Rohit Dev Gupta, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/809,001

(22) Filed: Mar. 4, 2020

(65) Prior Publication Data

US 2021/0135440 A1   May 6, 2021

Related U.S. Application Data

(63) Continuation-in-part of application No. 16/672,942, filed on Nov. 4, 2019.

(51) Int. Cl.
| | |
|---|---|
| H02G 3/32 | (2006.01) |
| H02G 3/04 | (2006.01) |
| H05K 7/14 | (2006.01) |
| F16M 13/02 | (2006.01) |
| H05K 7/18 | (2006.01) |
| H05K 7/02 | (2006.01) |

(52) U.S. Cl.
CPC ............. *H02G 3/32* (2013.01); *F16M 13/02* (2013.01); *H02G 3/045* (2013.01); *H02G 3/0456* (2013.01); *H05K 7/02* (2013.01); *H05K 7/1491* (2013.01); *H05K 7/183* (2013.01)

(58) Field of Classification Search
CPC .... G02B 6/3897; H05K 7/1491; H05K 7/183; H05K 1/0277; H05K 2201/10356; H05K 7/1489; H05K 7/18; H05K 5/0204; H05K 7/14; H05K 7/186; H02G 3/32; H02B 1/202; H04Q 1/064; H04Q 1/04; H04L 49/40

See application file for complete search history.

(56) References Cited

U.S. PATENT DOCUMENTS

| | | | |
|---|---|---|---|
| 3,926,310 A | * 12/1975 | Ackeret | G11B 23/0233 206/387.12 |
| 5,921,402 A | * 7/1999 | Magenheimer | H04Q 1/06 211/26 |

(Continued)

OTHER PUBLICATIONS

Oracle, "Oracle ZFS Storage Appliance Installation Guide", 2 pages, downloaded from Internet Sep. 20, 2019; https://docs.oracle.com/cd/E56021/01/html/E55847/govrz.html#.

(Continued)

*Primary Examiner* — Michael A Matey
(74) *Attorney, Agent, or Firm* — Edell, Shapiro & Finnan, LLC

(57) ABSTRACT

An apparatus includes a tray, a shaft connected to the tray, a bracket that secures the tray to a networking device such that the tray is distanced from a surface of the networking device, and a support post coupled to the tray via the shaft, the support post including: a rotating pin having a cylindrical passage through which the shaft passes, the rotating pin being coupled to the support post to allow the support post to rotate about the rotating pin and about the shaft, and a locking pin having a latch that is configured to engage with a corresponding opening on the tray to secure the support post to the tray.

20 Claims, 28 Drawing Sheets

(56) References Cited

U.S. PATENT DOCUMENTS

| | | | | |
|---|---|---|---|---|
| 6,845,207 B2* | 1/2005 | Schray | ................ | G02B 6/4452 |
| | | | | 385/135 |
| 7,848,102 B2* | 12/2010 | Fan | ........................ | G06F 1/181 |
| | | | | 361/679.58 |
| 8,770,532 B2 | 7/2014 | Ruiz et al. | | |
| 8,953,924 B2 | 2/2015 | Cote et al. | | |
| 9,212,765 B1* | 12/2015 | Chia | ........................ | H04Q 1/06 |
| 9,690,065 B2* | 6/2017 | Wiltjer | ................ | G02B 6/4455 |
| 10,076,054 B2 | 9/2018 | Goergen et al. | | |
| 10,117,348 B2 | 10/2018 | Babcock et al. | | |
| 2005/0115737 A1* | 6/2005 | Levesque | ............. | H02G 3/0493 |
| | | | | 174/100 |
| 2006/0113433 A1* | 6/2006 | Chen | .................... | H05K 7/1491 |
| | | | | 248/70 |
| 2008/0099635 A1* | 5/2008 | Laursen | ................... | H02G 3/30 |
| | | | | 248/68.1 |
| 2009/0078834 A1* | 3/2009 | Chen | .................... | H05K 7/1491 |
| | | | | 248/70 |
| 2009/0261213 A1* | 10/2009 | Yu | ........................ | H05K 7/1491 |
| | | | | 248/68.1 |
| 2010/0209068 A1* | 8/2010 | Womack | ............. | G02B 6/4471 |
| | | | | 385/137 |
| 2015/0271945 A1* | 9/2015 | Chen | .................... | H05K 7/1489 |
| | | | | 248/70 |
| 2015/0285406 A1* | 10/2015 | Kern | ........................ | F16L 3/26 |
| | | | | 248/68.1 |
| 2018/0035563 A1* | 2/2018 | Chen | .................... | H05K 7/1491 |
| 2018/0049341 A1* | 2/2018 | Chen | ........................ | H02G 3/32 |
| 2018/0252335 A1* | 9/2018 | Goergen | ................ | H04Q 1/09 |
| 2019/0234533 A1 | 8/2019 | Brouwer et al. | | |

OTHER PUBLICATIONS

Allied Electronics Automation, Panduit ER1.25-E4-X, 2 pages, downloaded from Internet Nov. 4, 2019, https://www.alliedelec.com/product/panduit/er1-25-e4-x/70044439/?gclid=Cj0KCQjw4-XIBRDuARIsAK96p3DLs6GM_PVzezqK5ZEfViYpu-oxkDDs3ETBhNwX3O7yoMuYCyvMoJQaAmO3EALw_wcB&gclsrc=aw.ds.

* cited by examiner

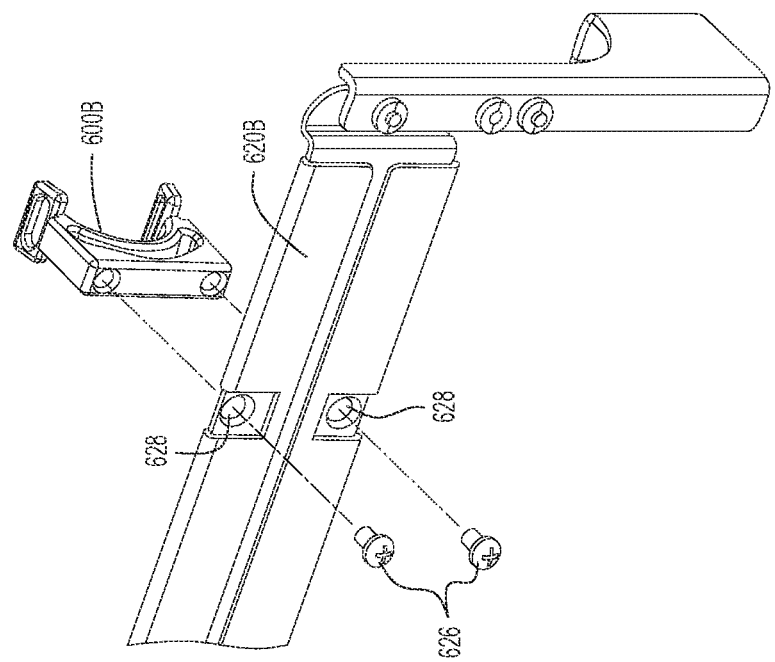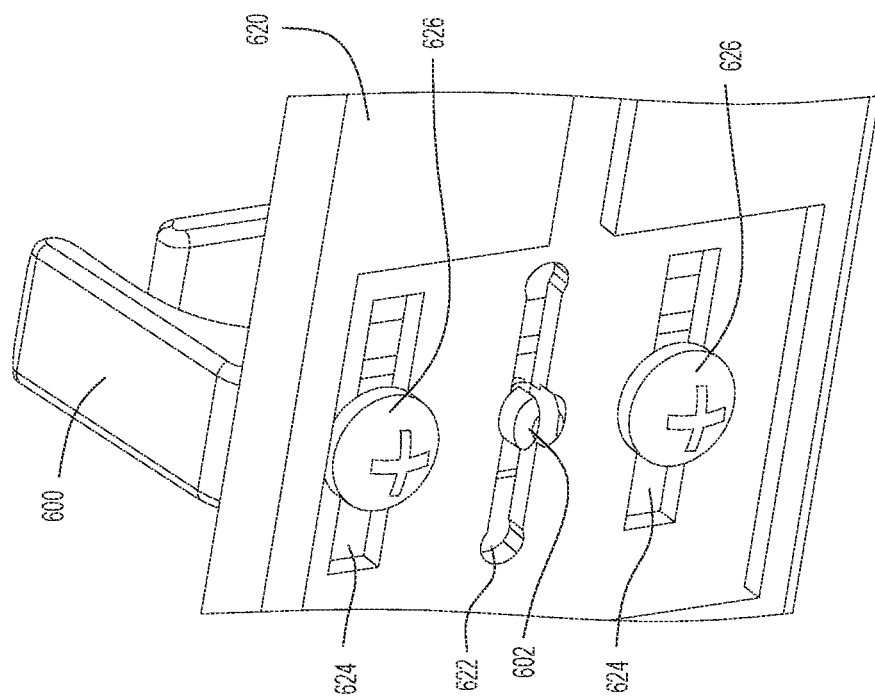
FIG.6B
FIG.6A

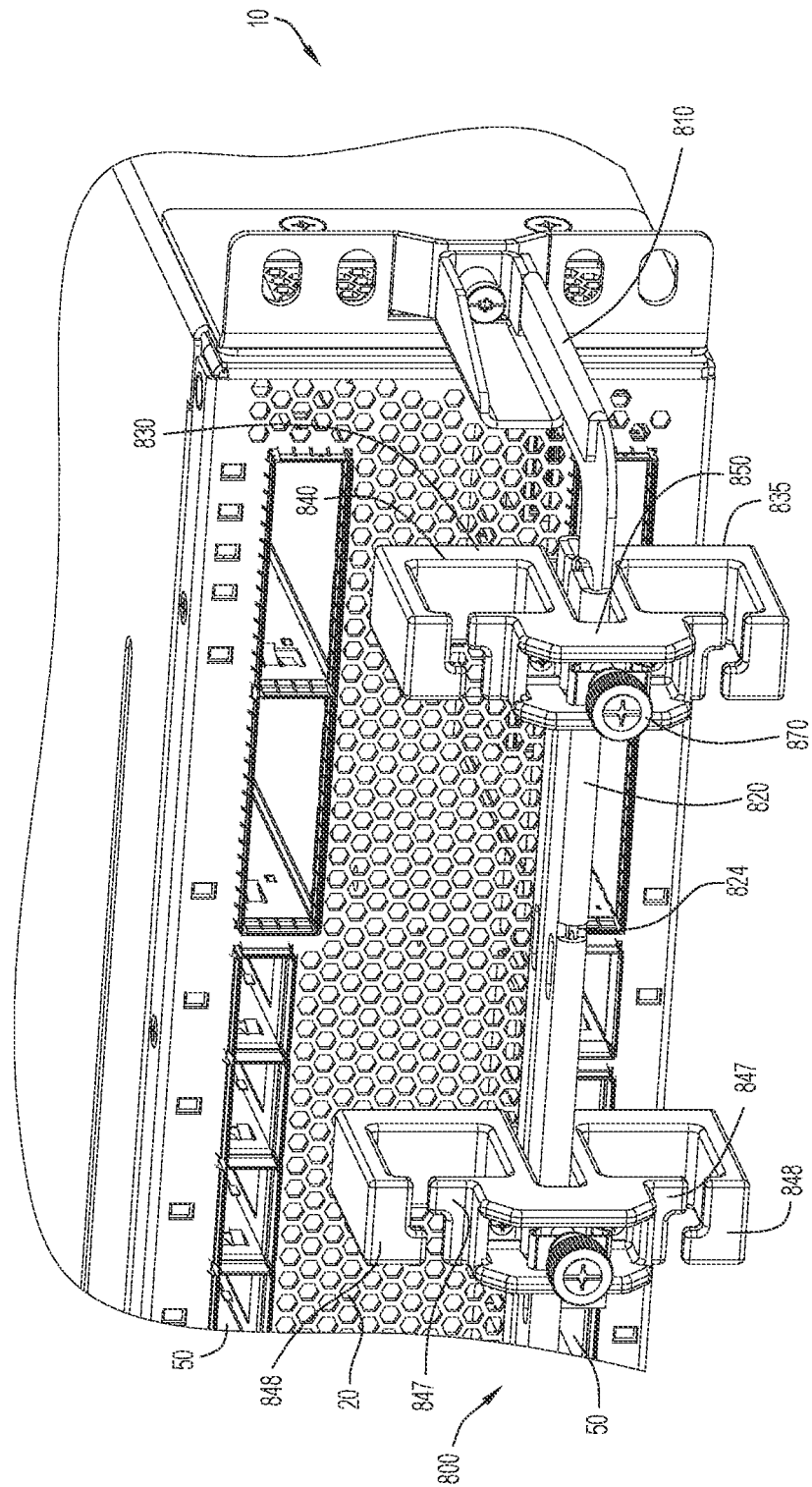

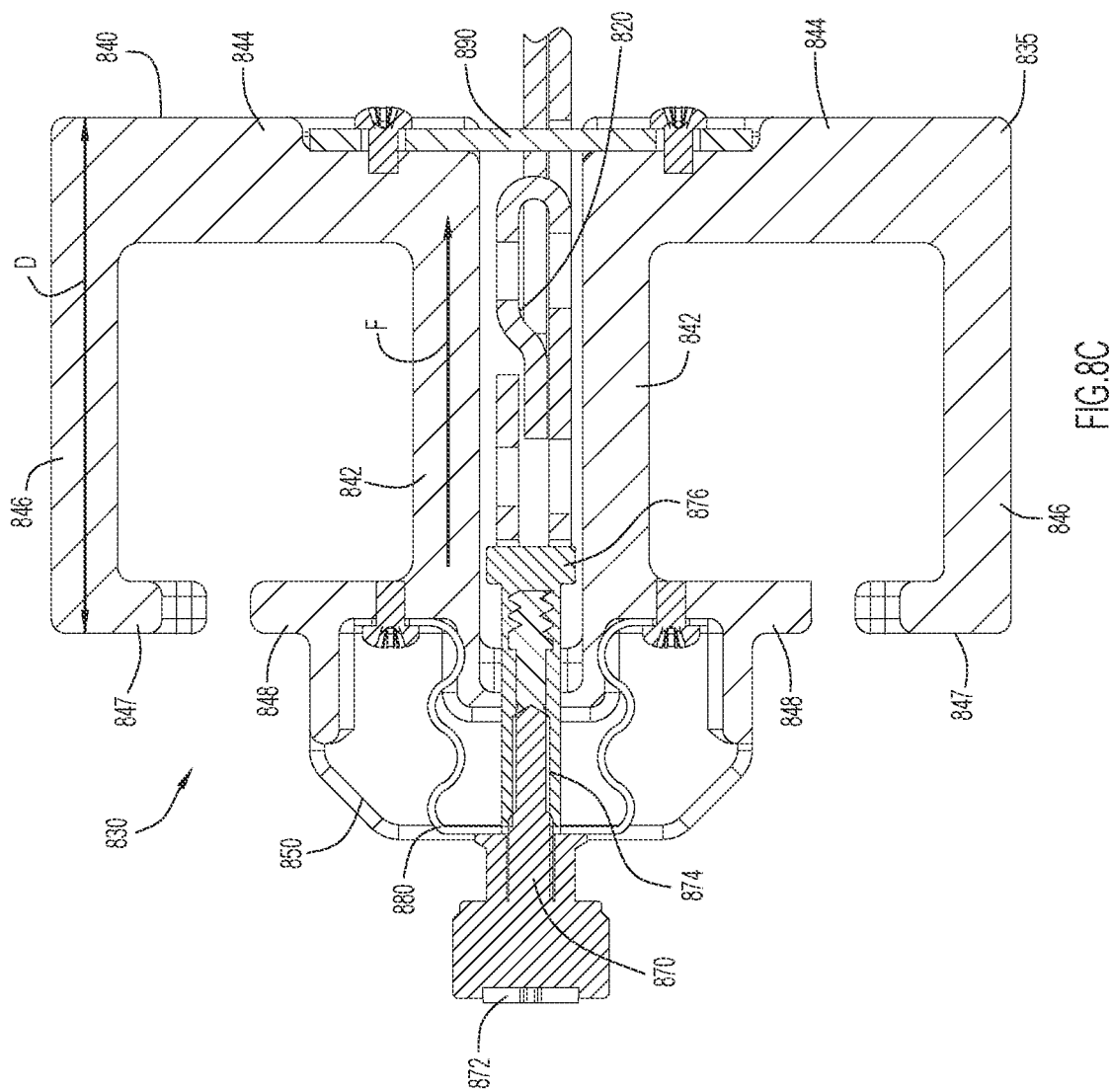

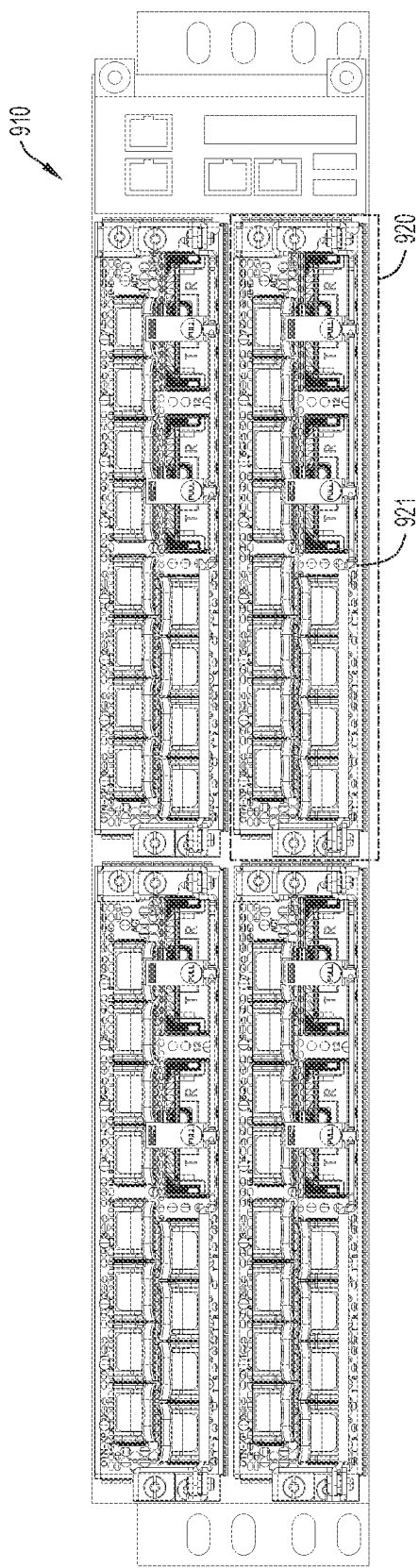
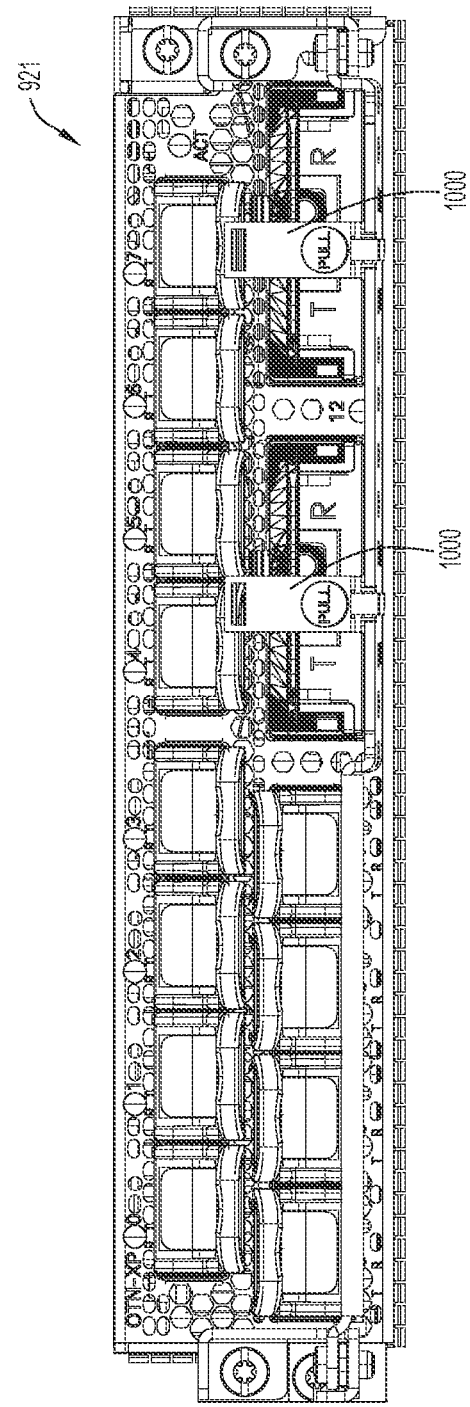
FIG.9A
FIG.9B

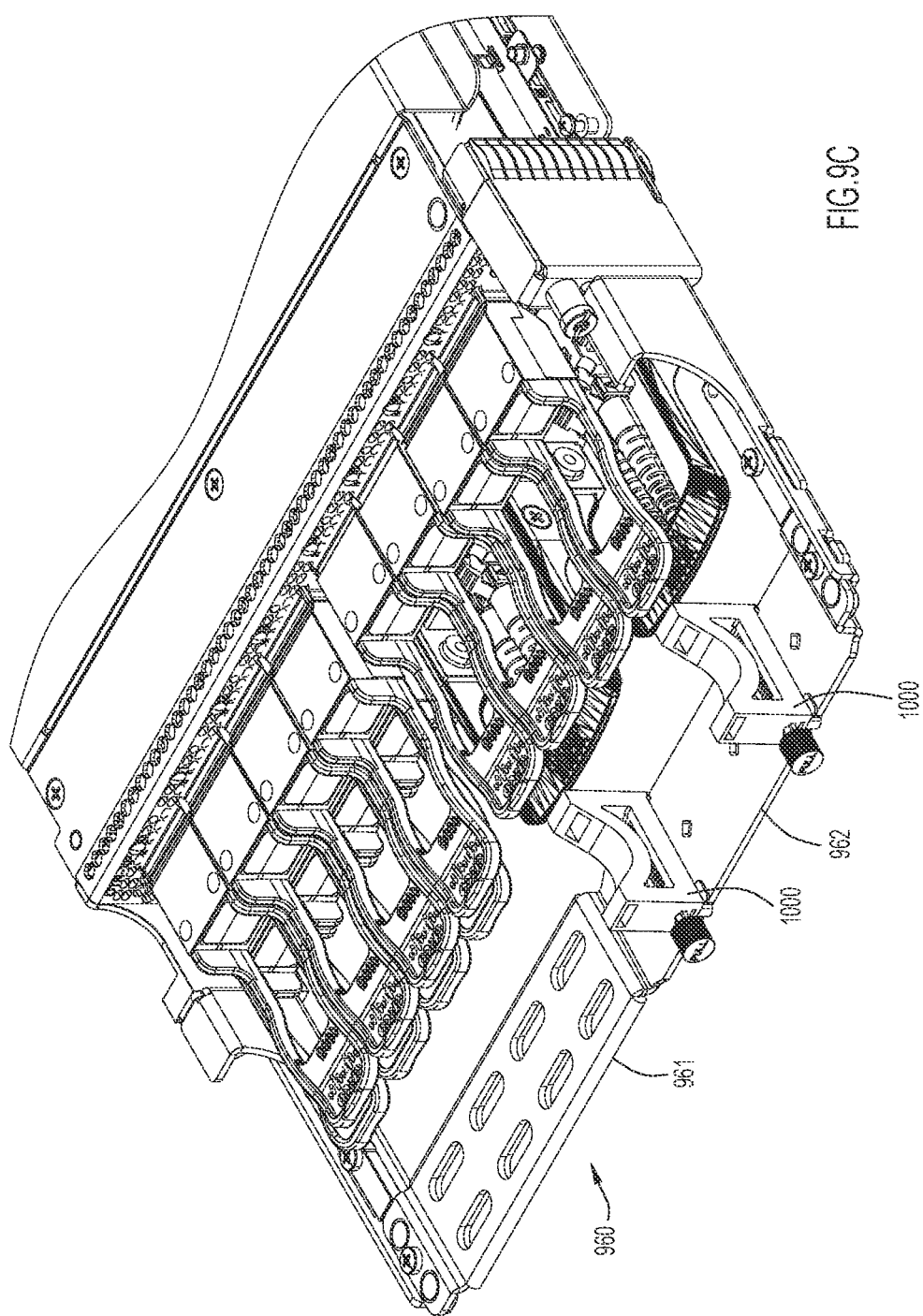

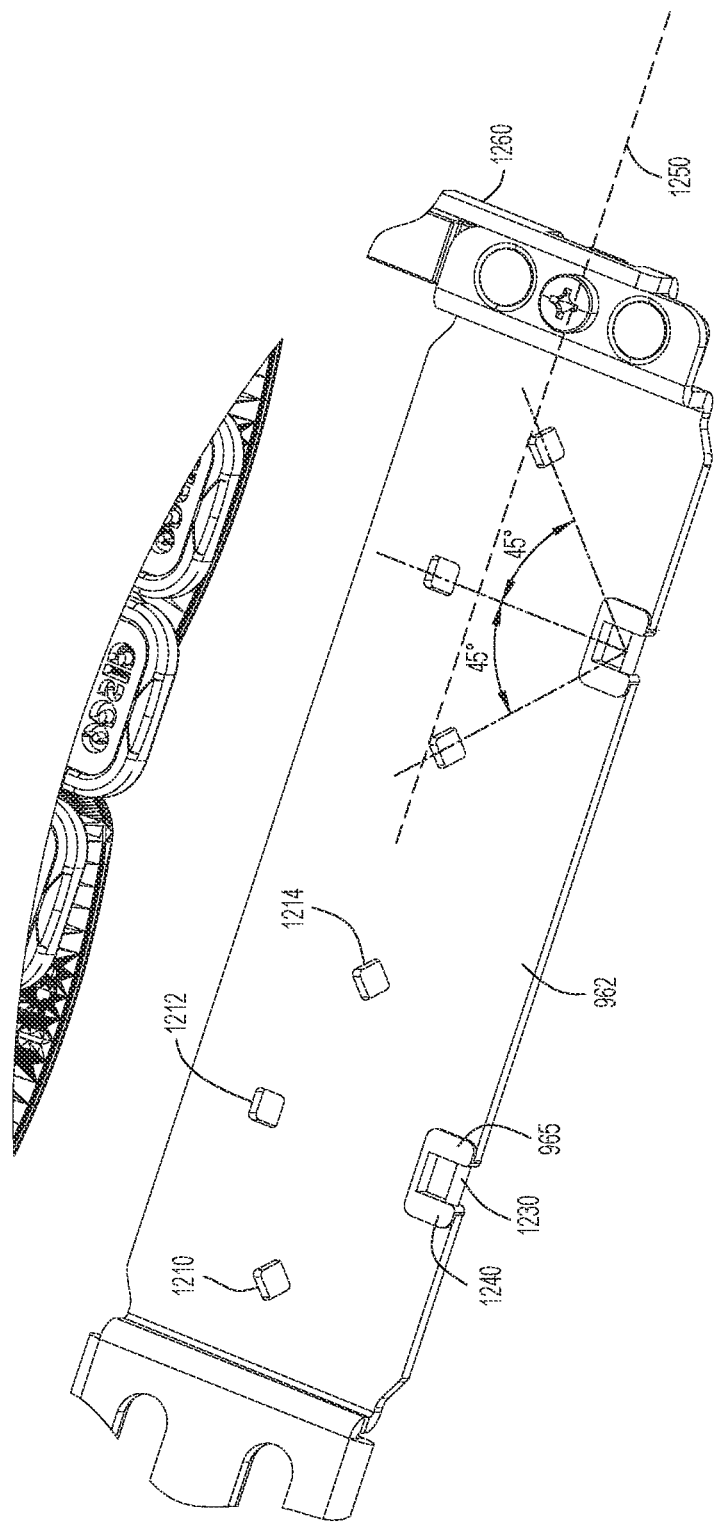

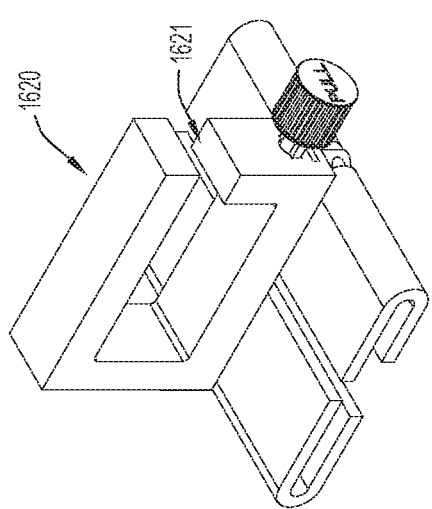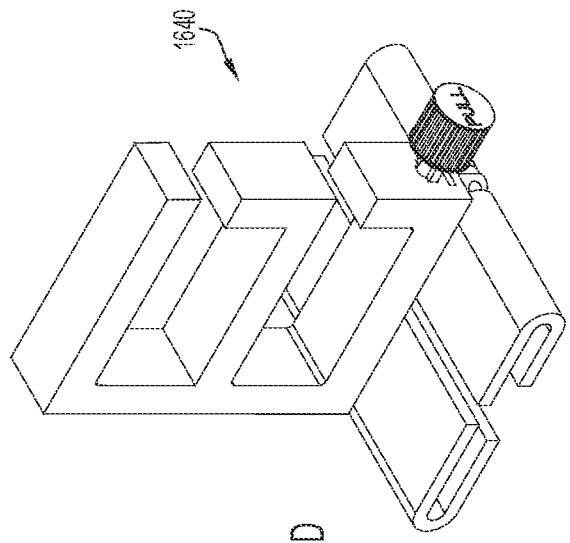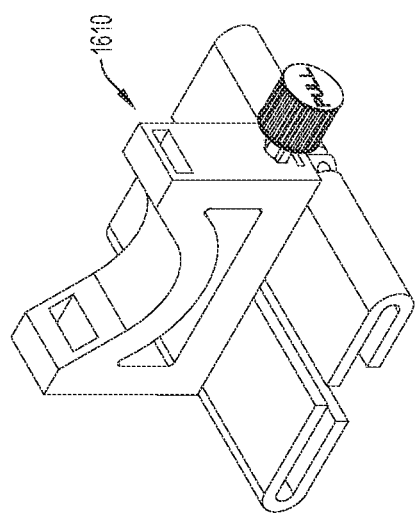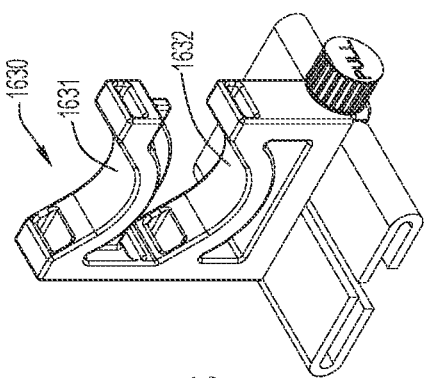

MINIMAL TOUCH POST FOR MULTI-LAYER CABLE ROUTING

CROSS-REFERENCE TO RELATED APPLICATION

This application is a continuation-in-part application of U.S. application Ser. No. 16/672,942, filed Nov. 4, 2019.

TECHNICAL FIELD

The present disclosure relates to networking equipment with multiple cable ports and accessory equipment to support network cables connected with the cable ports.

BACKGROUND

With ever increasing demands associated with processing larger amounts of data for business and other applications, networking devices (e.g., hubs, switches, routers, gateways etc.) have become more sophisticated with increasing port densities to facilitate greater numbers of cables (fiber optic and/or copper) to connect such devices with other networking equipment in order to efficiently transmit data to and from desired destinations. However, the large numbers of cables emerging from a network device can be difficult to physically support while maintaining a secure connection between the cable ports of the device and another physical connection. Certain known solutions bundle together cables that are connected with device ports so as to maintain an ordered flow or routing of the cables along or proximate a port side (e.g., front side) of the device. However, when bundling the cables together, they can become heavy such that more than one physical support may be required (e.g., a number of supports provided at, e.g., about every 1.5 to 2.0 inches in distance) in order to maintain a minimal bend radius for the cables. Further, physical structure (e.g., clips, brackets and/or other types of suspension structure) provided to support bundles of cables can impede or cause a blockage to port accessibility (e.g., for module replacements and/or connection of a cable to a port). This is particularly a concern for rows of ports arranged along a port side of a device housing in which cables from different rows are all grouped together.

BRIEF DESCRIPTION OF THE DRAWINGS

FIGS. 6A and 6B depict alternative embodiments of securing structure for supporting a cable bundle support post on a rail of a cable support and routing system.

FIG. 8B depicts a partial enlarged view of the networking device with that cable support and routing system of FIG. 8A.

FIG. 8C depicts a partial view in cross-section of the cable support and routing system of FIG. 8A.

FIGS. 9A-9C depict a networking device including a cable support and routing system to bundle groups of cables connected with the networking device in accordance with an example embodiment.

FIGS. 12A and 12B depict a tray on which the support post is disposed in accordance with an example embodiment.

FIGS. 16A-16D show different possible configurations of the support post in accordance with an example embodiment.

DESCRIPTION OF EXAMPLE EMBODIMENTS

Overview

Figure 1:
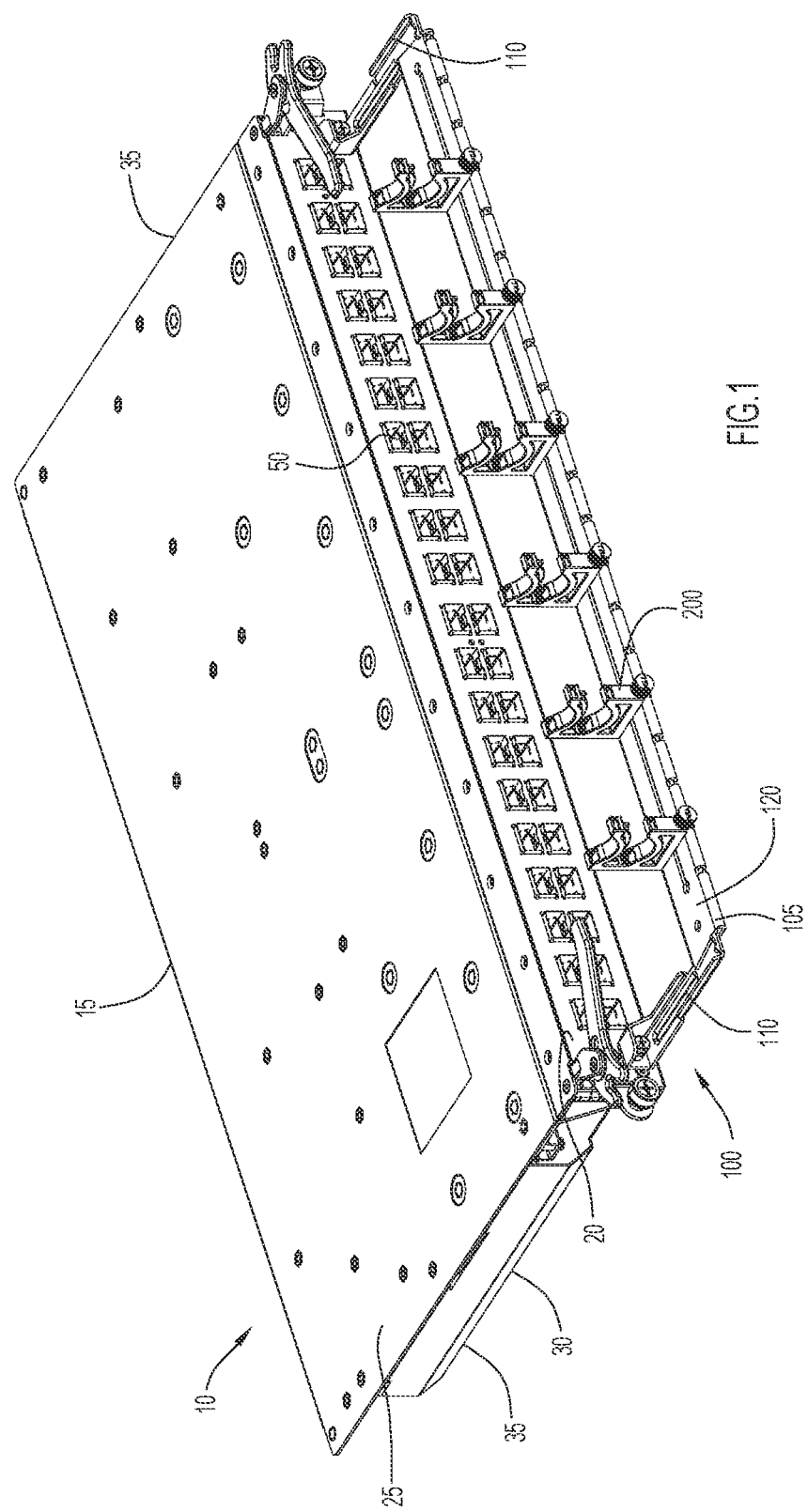
FIG. 1 depicts a front view in perspective of a networking device including a cable support and routing system to bundle groups of cables connected with the networking device in accordance with an example embodiment.

In one embodiment an apparatus includes a tray, a shaft connected to the tray, a bracket that secures the tray to a networking device such that the tray is distanced from a surface of the networking device; and a support post coupled to the tray via the shaft, the support post including: a rotating pin having a cylindrical passage through which the shaft passes, the rotating pin being coupled to the support post to allow the support post to rotate about the rotating pin and about the shaft; and a locking pin having a latch that is configured to engage with a corresponding opening on the tray to secure the support post to the tray.

In another embodiment, a networking device is provided and includes a housing including electronic components, wherein a plurality of ports are provided along a port side of the housing, a tray, a shaft connected to the tray, a bracket that secures the tray to the housing such that the tray is distanced from a surface of the housing, and a plurality of support posts coupled to the tray via the shaft, wherein each support post including: a rotating pin having a cylindrical passage through which the shaft passes, the rotating pin being coupled to the support post to allow the support post to rotate about the rotating pin and about the shaft; and a locking pin having a latch that is configured to engage with a corresponding opening on the tray In still another embodiment a method includes rotating a support post, connected to a tray via a shaft, from a first position in which the support post accommodates cables leaving a networking device, to a second position that provides access to ports of the networking device, attaching the cables to the ports of the networking device, rotating the support post from the second position to the first position; and routing the cables to lay on the support post.

Example Embodiments

A cable support and routing system is provided that couples a networking device to facilitate support and routing of bundles of cables connected at a port side (e.g., the front side) of the networking device. A networking device, as described herein, refers to any computing and/or other device that facilitates or supports networking communications between two or more computing devices distanced from each other. Some non-limiting examples of networking devices include hubs, routers, switches, digital line cards, data storage devices and/or other computing devices, etc. that receive and transfer data over any one or more types of networks and/or combinations of networks (e.g., local area networks, wide area networks, virtual private networks, etc.). The devices can be located in data centers (e.g., which require transfer of data signals and/or electrical power between multiple devices) and/or at any other locations which require the routing of numerous bundles of cables from one or more devices to other connection locations. The networking devices can transfer and receive data over any suitable types of Ethernet and/or other types of data transmission/network cables, such as optical cables (e.g., utilizing fiber optics) and/or electrical cables (e.g., utilizing copper or other conductive wiring). A typical networking device can include a plurality of cable ports at a port side of the device, where the port side is typically a front side of the device. Each cable port is suitably dimensioned and configured to receive a corresponding network cable via a female to male mating connection. The cable support and routing system as described herein facilitates mounting of a plurality of cables by the system and routing such cables in a bundle to another connection distanced from the networking device, where the system enables a secure connection while minimizing bending of the cables beyond a certain radius of curvature or bend radius along their route thus ensuring optimal transmission of data by the cables to and from the networking device.

Referring to FIGS. 1-4, an example embodiment is depicted of a cable support and routing system 100 that is coupled with a networking device 10 in a manner as described herein. The networking device 10 comprises a chassis or housing that includes a front panel or front side 20 (also referred to herein as a port side), a rear panel or rear side 15, a top panel or top side 25, a bottom panel or bottom side 30, and side panels or sides 35 that connect between top, bottom, front and rear sides to define an enclosure therebetween that houses computing and/or other electronic components (e.g., a printed circuit board including memory, one or more processors and/or other components formed thereon or integrated therewith, cooling fans, etc.) of the networking device. The housing can be constructed of a metal and/or other suitably rigid material that effectively protects the electronic components secured within the housing. At the port side or front side 20 of the housing is provided a plurality of ports 50 (e.g., network cable ports). The ports can be configured to provide any suitable one or more types of connection between the device and corresponding cables or other signal carriers that mate with the ports including, without limitation, Ethernet cable ports, optical cable ports, USB ports, and ports for providing an electrical power connection between the device 10 and any other device and/or power source. The ports are typically arranged in one or more rows at the front housing side of a networking device (e.g., two rows of ports 50 for the networking device 10 depicted in the figures, with one row aligned vertically over the other) so as to provide a high density arrangement of ports efficiently along the port side surface of the device. The ports 50 are further configured of a certain type to facilitate a connection with a corresponding cable in a male-to-female mating connection. Further, the ports 50 can be of the same type or different types. For example, the front side of the device housing can include ports of different types arranged in groups (e.g., in separate rows, columns or other combinations).

The cable support and routing system 100 includes a generally U-shaped tray 105 that includes a rail 120 that extends at least a portion (e.g., a substantial portion) of the length of the housing front side 20. The components of the system 100 can be constructed of any suitable materials (e.g., metals, molded and/or other types of plastic materials, etc.) having a sufficient rigidity and strength to support and route cables in the manner described herein. A transversely extending bracket 110 is secured at each lengthwise end of the rail 120 to form the general U-shape for the-. Each bracket 110 secures to a portion of the housing front side 20 (e.g., at or near a lengthwise end of the housing front side) via one or more threaded screws or any other suitable fastener. Accordingly, the rail 120 is secured at a distance from the surface of the front side 20 (where the distance is based upon the length of the brackets 110). The rail 120 includes an elongated cut-out section extending a lengthwise dimension of the rail that defines a groove or track 122 along which a post can be coupled so as to facilitate sliding movement of the post along the rail via the track as further described herein. The rail 120 further includes a plurality of spaced apart notches 124 located along a lengthwise extending outer edge of the rail. As further described herein, the notches 124 provide locking or stop points for a post coupled with the rail.

Figure 3:
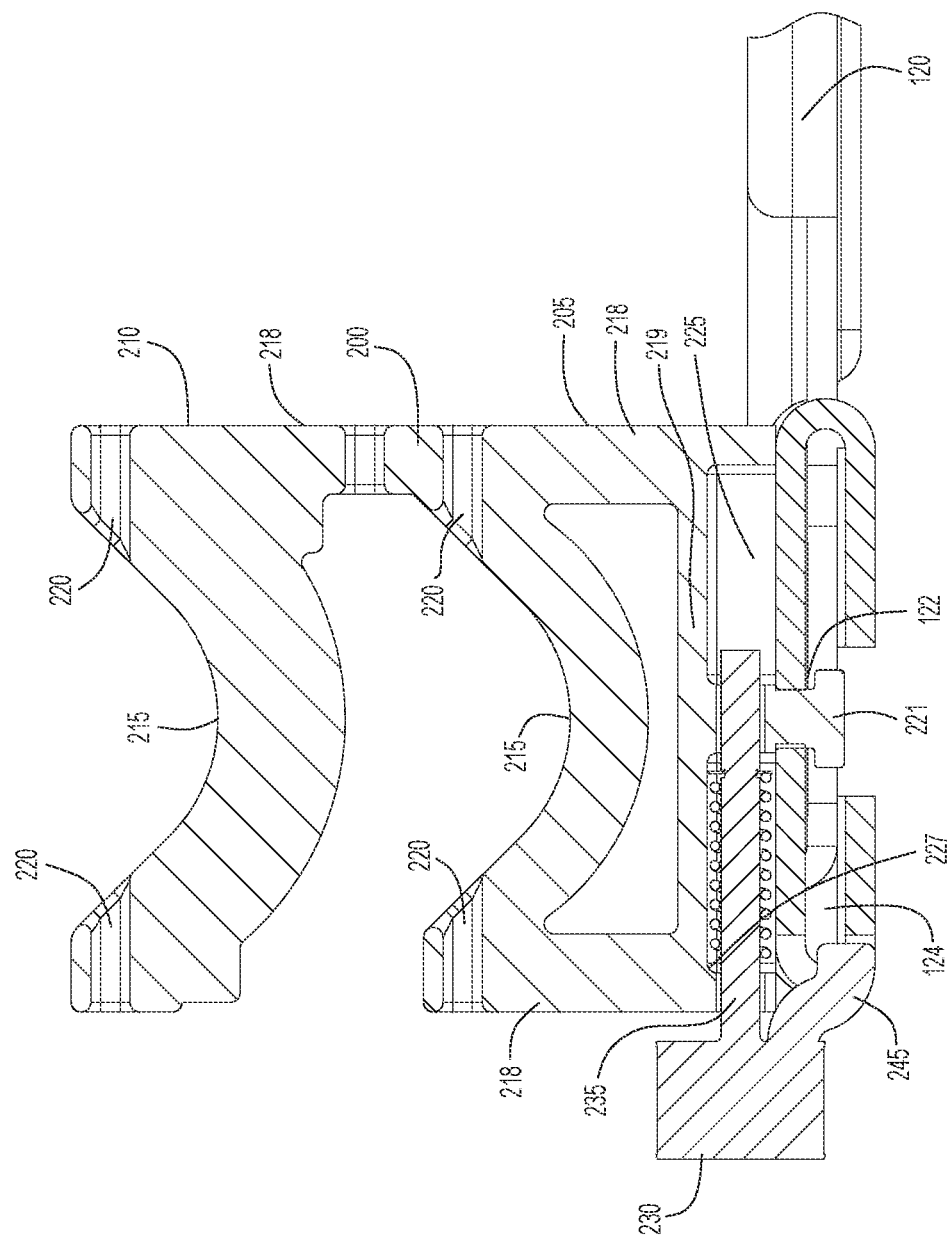
FIG. 3 depicts a partial view in cross-section of the cable support and routing system of FIG. 1.
Figure 4:
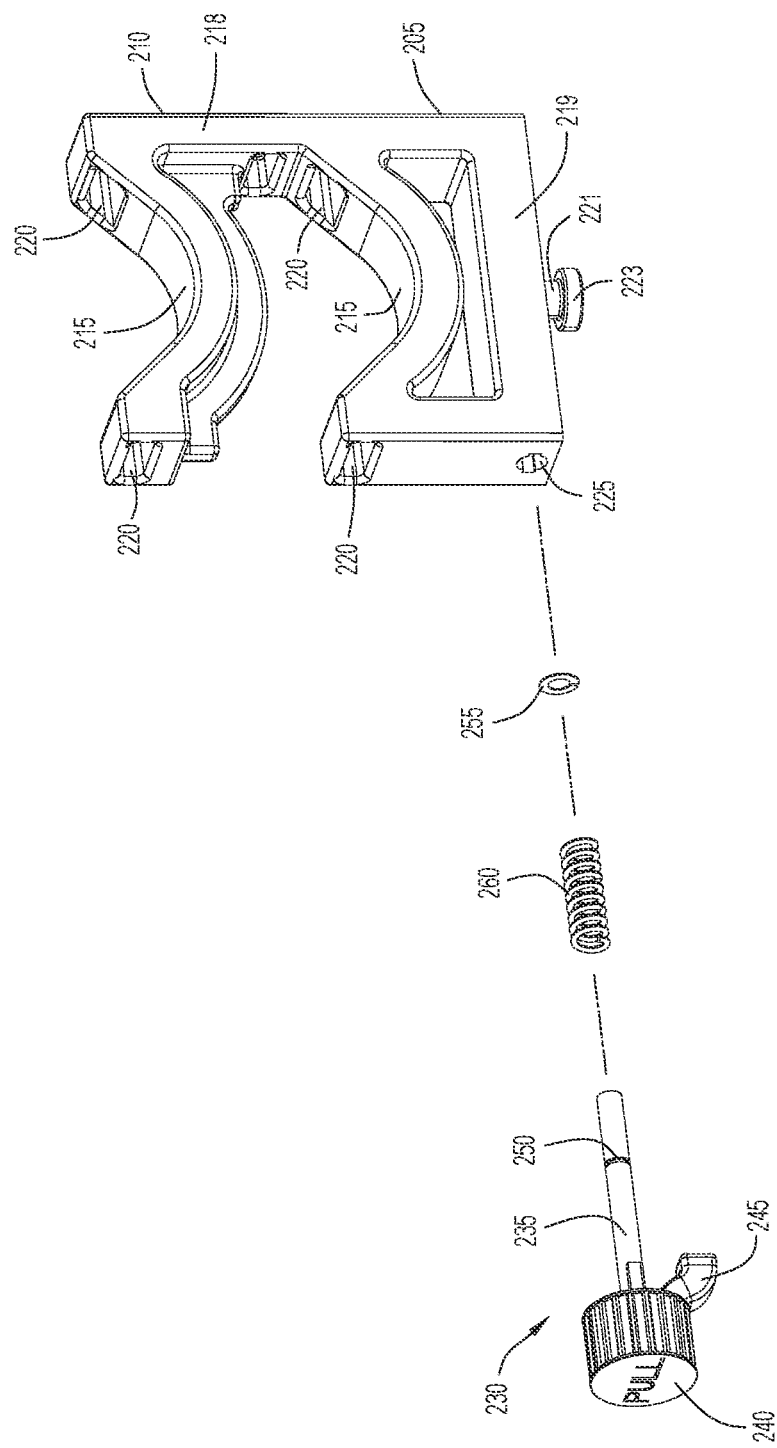
FIG. 4 depicts an exploded view of an example embodiment of a cable bundle support post for the cable support and routing system of FIG. 1.

The system further includes one or more cable bundle support posts that removably couple with the rail, where the position of each post can further be adjusted along the rail and, in some embodiments without removing the post from the rail (e.g., via a sliding movement of the post along a portion of the rail). Referring to FIGS. 3 and 4, a post 200 includes a lower or first support member 205 and an upper or second support member 210 connected with and supported by the first support member 205 (i.e., the second support member 210 is vertically aligned with the first support member 205). Each support member 205, 210 includes a support structure that supports a bundle of cables and facilitates routing of such cables to a location distanced from the device 10 while minimizing bending of the cables along their routes. In particular, each support member 205, 210 includes a generally U-shaped or concave arm or concave member 215 that is supported by at least one leg 218, where the concave member 215 of the second support member 210 is separated a distance from the concave member 215 of the first support member 205. In particular, the first support member 205 includes two legs 218 at each end of the concave member 215, while the second support member 210 supports the concave member 215 with a single leg located at one end of the concave member 215 (so that the concave member 215 of the second support member 210 is cantilevered from its leg 218).

Figure 2:
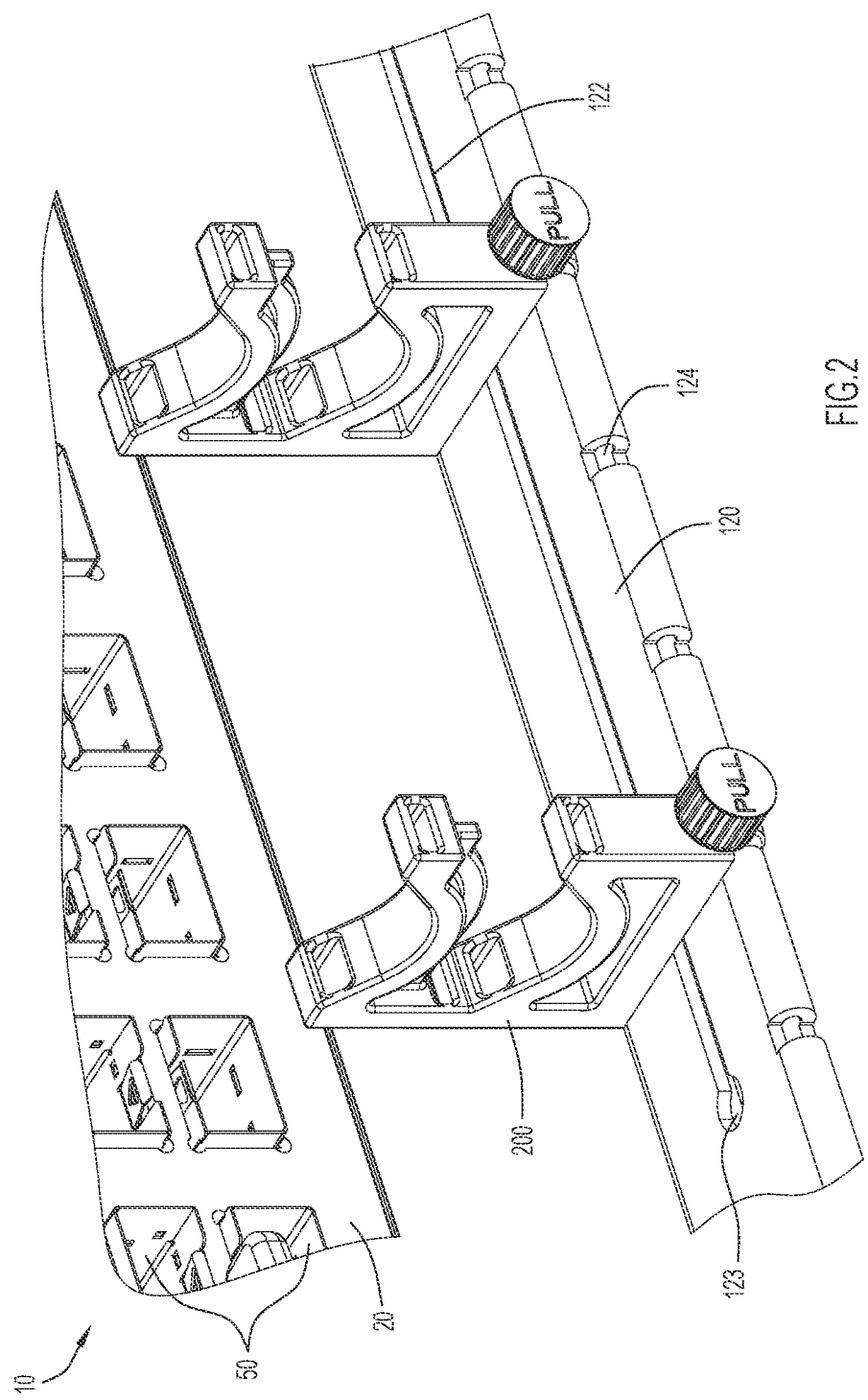
FIG. 2 depicts a partial enlarged view of the networking device with cable support and routing system of FIG. 1.

Each of the legs 218 of the first support member 205 are further connected at their lower ends with an upper surface of an elongated base or beam 219. A projection 221 extends from a lower surface of the beam 219 (e.g., at around a central lengthwise location) and is suitably dimensioned to be received within the groove or track 122 of the rail 120. The projection 221 can further include a head 223 at its free end, where the head 223 has a larger dimension than the projection 221 to prevent removal of the post 200 from the rail when the projection is engaged with the rail track. The track 122 can include one or more locations (e.g., at one or both ends of the track, such as location 123 as shown in FIG. 2) having a larger dimension to accommodate insertion and removal of both the projection 221 and its head 223 through the track 122 to selectively couple and decouple the post 200 from the rail 120.

The beam 219 includes a linear bore 225 extending through a portion of the beam and emerging at its front surface (i.e., a surface that faces away from the rail 120 when the post 200 is coupled with the rail). The bore 225 is suitably dimensioned to permit entrance and retention of a portion of a locking pin 230 within the bore when the locking pin is inserted through the bore opening at the front surface of the beam 219. The locking pin 230 includes an elongated shaft 235 and a finger gripping head 240 disposed at one end of the shaft. The shaft 235 is suitably dimensioned for partial or complete insertion within the bore 225 (as shown, e.g., in FIG. 3), whereas the head 240 is larger in size such that it cannot enter the bore. The shaft 235 includes an annular cut-out portion or indentation 250 that is dimensioned to receive and retain a partial annular locking member or C-Clip 255. A coil spring 260 or other suitable resilient member is also provided within an enlarged cavity within the bore 225. When the locking pin 230 is installed within the bore 225, at least a portion of the shaft 235 including indentation 250, C-Clip 255 and spring 260 reside within the enlarged bore cavity with the spring 260 being located between the C-Clip 255 and the head 240. The bore opening further has a reduced or smaller dimension than the transverse dimension(s) of the enlarged cavity within the bore 225, where an interior annular ledge or abutment 227 is provided at the transition from the enlarged cavity to the bore opening to prevent escape of the spring 260 from the bore. In this configuration, the spring 260 surrounds a portion of the shaft 235 and engages with the abutment 227 within the bore 225 and the C-Clip 255 of the shaft 235 so as to bias the a portion of the locking pin 230 between the head 240 and the indentation 250 (where the C-Clip is engaged) within the bore.

The locking pin 230 further includes a curved locking member 245 that extends from the finger gripping head 240 and/or the shaft 235 (at a location near the gripping head) below and in a direction corresponding with the linear dimension of the shaft 235. The locking member 245 is suitably dimensioned to fit within each notch 124 disposed along the front edge of the rail 120. The locking pin 230 also has protruded keys on opposite sides of the shaft 235 that align with matching cutouts in bore 225. This feature prevents the rotation of locking pin 230 in the bore 225, to ensure that curved locking member 245 aligns well with notch 124 on rail 120.

During operation, a post 200 can be coupled with the rail 120 by inserting the projection 221 at the lower end of the beam 219 (serving as a post base) into the track 122 (e.g., by insertion of the projection 221 and head 223 into the enlarged portion at the location 123 of the track 122) and moving or sliding the post along the track 122 to a desired position. The post 200 can further be locked in place along the track 122 by engaging the locking member 245 within a notch 124 of the rail 120. This can be achieved by pulling the finger gripping head 240 outward and away from the rail 120, which causes a compression of the spring 260 within the bore 225 (i.e., at a location of the shaft 235 between the C-Clip 255 and the abutment 227 within the bore). The post 200 can be positioned along the rail 120 so that the locking member 245 is aligned with the notch 124. When the head 240 is released, the bias of the spring 260 forces the head 240 back toward the rail 120 so as to engage the locking member 245 with the notch 124 to lock the post 200 in a fixed position. Release of the post 200 from this position is easily achieved by pulling the head 240 away from the rail 120 so as to disengage locking member 245 from the notch 124.

As shown in the figures, a plurality of posts 200 can be coupled with the rail 120 and moved by sliding the posts along the rail to desired positions at selected distances from each other to facilitate support and routing of cables from the ports 50 of the device 10.

Figure 5:
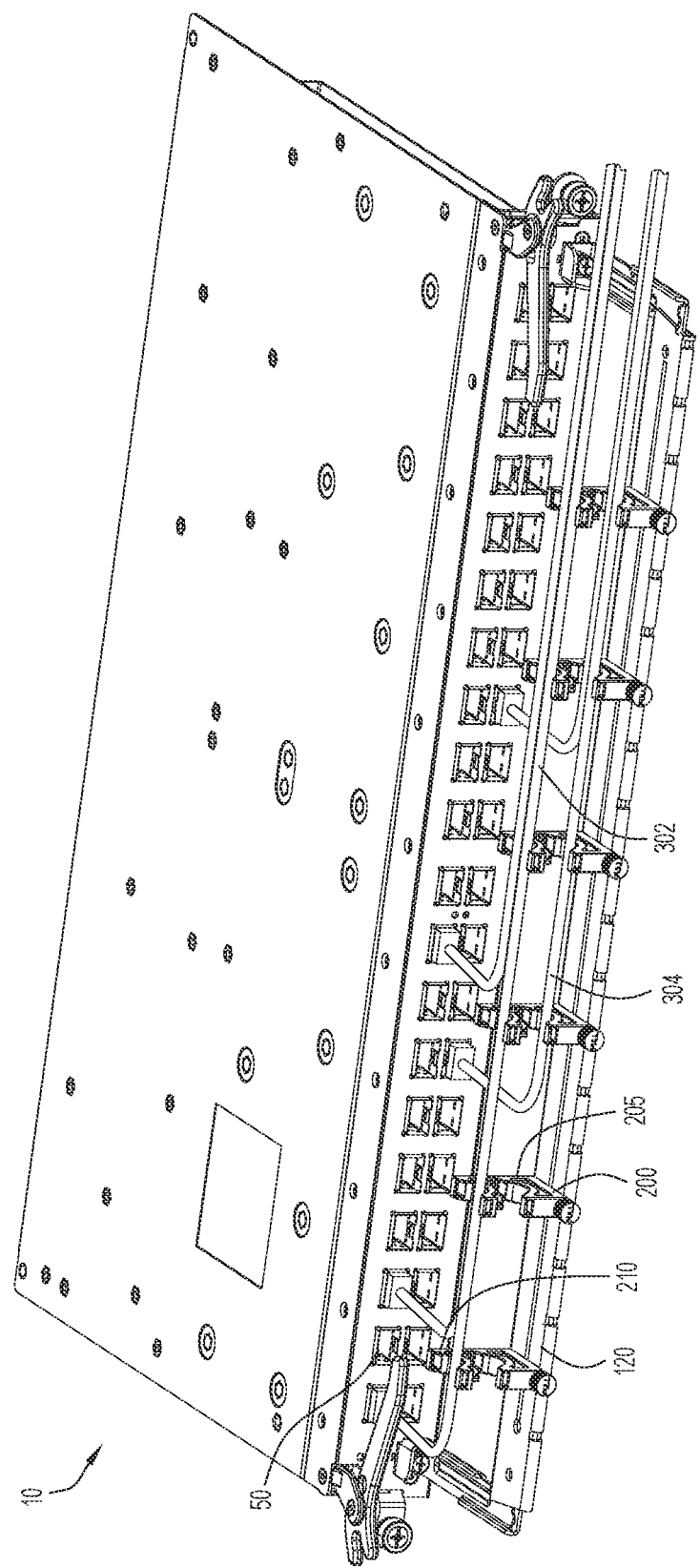
FIG. 5 depicts a front view in perspective of the networking device with cable support and routing system of FIG. 1 including bundles of cables supported and routed by the system.

Each post 200 can support and route a plurality of cables connected with ports 50 at the port side or front side 20 of the device 10 utilizing either or both of the concave members 215 of the first support member 205 and second support member 210. The cables are placed over so as to rest upon the concave members 215 for each support member. As shown, e.g., in FIG. 5, a plurality or second group of cables 302 connected with a second (e.g., upper) row of ports 50 can be bundled together and supported by the concave member 215 of the second (upper) support member 210 for each post 200 (where one or more cables engage the concave member 215). A sufficient number of posts 200 are provided to ensure adequate support of the second group of cables 302 and minimization of a drooping, bending or extreme radius of curvature forming along the trajectory of the cables as the cables are directed along and toward an edge of the housing front side 20 and away from the housing for connection with another device or connection structure. In addition, a plurality or first group of cables 304 connected with a first (e.g., lower) row of ports 50 can be bundled together and supported by the concave member 215 of the first (lower) support member 205 for each post 200 (where one or more cables engage the concave member 215). The pair of concave members 215 of each post 200 which are spaced apart from each other facilitates support and routing of two or more cables separated and segregated from each other. Thus, as shown in the example embodiment of FIG. 5, the second (upper) row of cables 302 are bundled together, supported and routed by the second (upper) support members 210 of the posts 200, while the first (lower) row of cables 304 are bundled together, supported and routed by the first (lower) support members 205 of the posts 200. The first and second groups of cables are thus separated and segregated from each other by the posts 200 as they are supported and routed from the device to another location. The first and second groups of cables can further be of the same type or of different types. It is noted that FIG. 5 shows cables 302, 304 routing in one direction (i.e., to the right). However, cables 302, 304 could also be routed to the left or in different directions from each other.

While not shown, the posts can further include straps and/or other additional securing structure, such as Velcro (i.e., hook and loop fastener) straps, that can be passed or threaded through openings 220 provided at the ends of each concave member 215 of the posts 200. The straps can be tightened around a bundle of cables resting upon a concave member 215 so as to cinch and hold the bundle of cables against the concave member 215.

The configuration of the posts 200 and rail 120 facilitates easy sliding movement of each post 200 to a desired location along the rail 120. This allows for placement of posts 200 to enhance access of ports 50 (e.g., for connection of cables to such ports) and/or access to other locations along the housing front side 20 so as to facilitate insertion/installation or removal of other components for the device 10 (e.g., line cards, internal fans, or other hardware components) at the housing front side 20. In fact, very little effort and minimal touch is required to unlock a post 200 (e.g., by pulling the finger gripping head 240 of the locking pin 230 outward and away from the rail 120) so as to move it by sliding the post along the rail to a different location. This can further be accomplished while having one or more cables supported within one or both concave members 215 of the posts 200. In this configuration, the bundles of cables are all supported and routed by posts 200 which are coupled with and located above the rail 120 of the system 100.

The cable support and routing system can be modified in a number of ways while still being configured to support bundles (i.e., a plurality of) cables as well as separate and segregate different bundles of cables connected with a networking device.

For example, referring to FIGS. 6A and 6B, the system can be revised in a manner in which a plurality of posts are connected to the rail of the system to support and route network cables from their port connections with a networking device to a location distanced from the device while minimizing bending of the cables along their routes. In the example embodiment of FIG. 6A, a post 600 is similar in configuration to the post 200 of FIGS. 1-5, with the exception that the post 600 does not include a bore or locking pin. The rail 620 is similar in configuration as the rail 120 of FIGS. 1-5 with the exception that rail 620 includes a central groove or slot 622 that is smaller in linear dimension than the slot or track 122 of the rail 120. The slot 622 is configured to receive and retain a guide post or protrusion 602 extending from a lower surface of the base for the post 600. Located alongside the slot 622 on the rail 620 is one or more further securing slots 624 (e.g., two securing slots 624 are provided, one slot 624 on each side of slot 622) which have a similar lengthwise dimension and extend in the same general direction as and are generally parallel with the slot 622. A threaded fastener 626 (e.g., a screw or bolt) extends through each slot 624 and secures with a corresponding threaded bore of the base for the post 600. This configuration allows the post 600 to have a limited sliding movement along the slot 622 of the rail 620, where the post 600 can further be fixed in place along the rail by tightening of the threaded fasteners to force the post base against the rail. The rail 620 can further include a plurality of slots 622 (and corresponding securing slots 624) provided at spaced locations along the rail to facilitate placement of one or more posts 600 at different locations along the rail.

In FIG. 6B, another embodiment is depicted for securing a post to the rail, where the rail 620B includes one or more bore holes 628 and the post 600B includes a corresponding one or more threaded bore holes along a lower surface of its base to facilitate fastening of the post to the rail via threaded fasteners 626 (i.e., the fasteners 626 are inserted through the bore holes 628 and into the threaded bore holes of the post 600B to connect the post to the rail). The rail 620B can include sets of bore holes 628 at a plurality of locations along a length of the rail 620B to facilitate fastening of one or more posts 600B at varying locations along the rail.

Figure 7A:
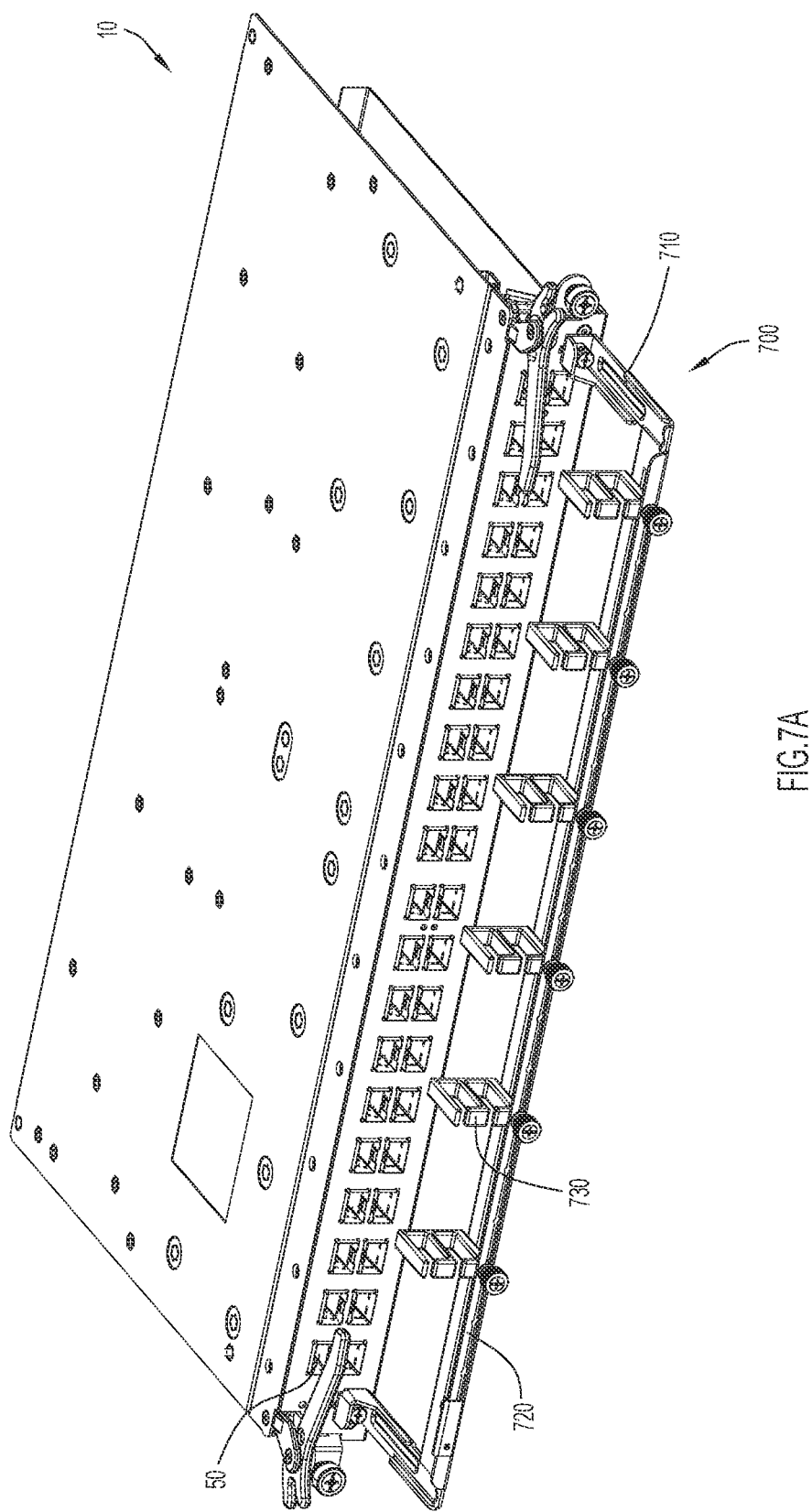
FIG. 7A depicts a front view in perspective of a networking device including a cable support and routing system to bundle groups of cables connected with the networking device in accordance with another example embodiment.
Figure 7B:
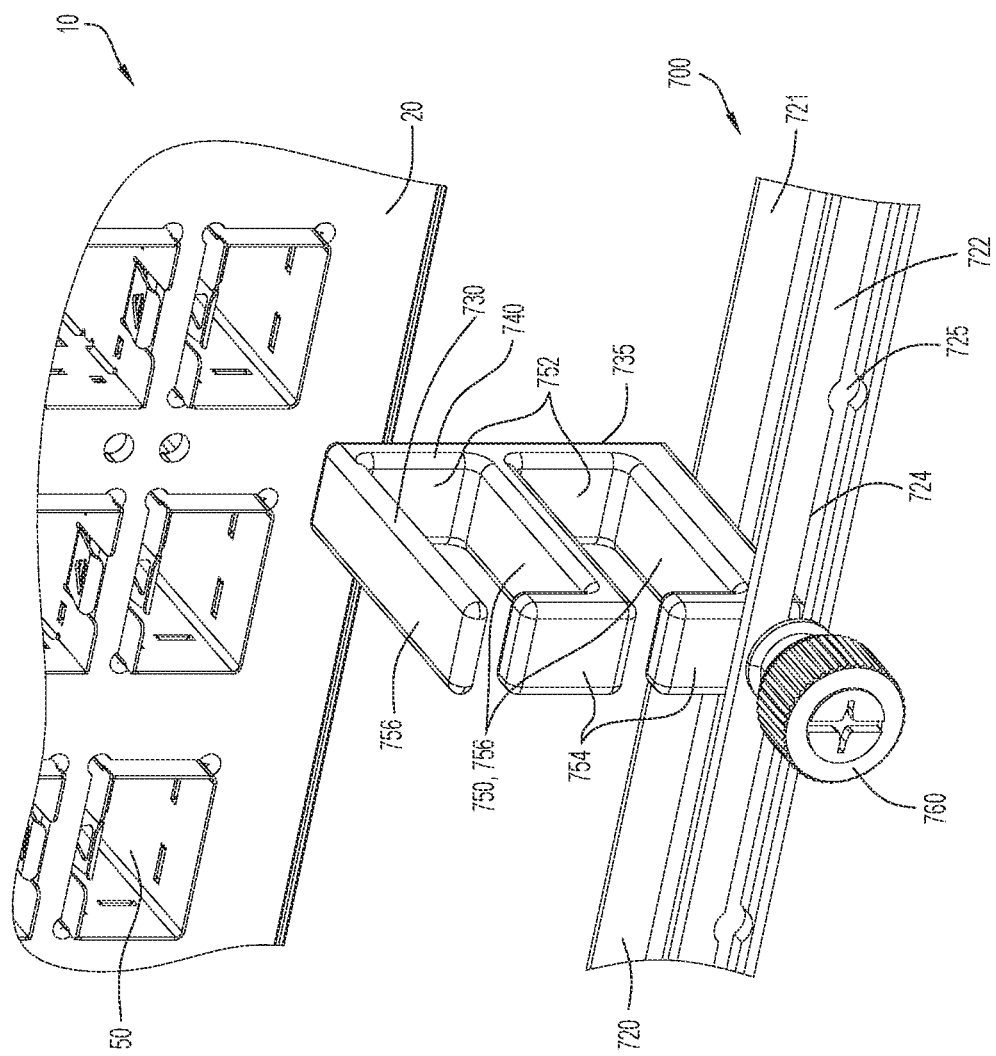
FIG. 7B depicts a partial enlarged view of the networking device with cable support and routing system of FIG. 7A.

In another embodiment depicted in FIGS. 7A and 7B, a cable support and routing system 700 is secured to a port side or front side 20 of a networking device 10 (where the device 10 includes a plurality of ports 50, such as network ports, provided in rows along the front side 20) in a manner similar to the system 100 depicted in FIGS. 1-5. In particular, the system 700 includes a generally U-shaped tray that includes a rail 720 secured to the housing front side 20 via a pair of brackets 710, where each bracket 710 is disposed at a lengthwise end of the rail 720. The rail 720 has a general L-shaped cross-section, including a base 721 and a mounting wall 722 that extends vertically from an outward edge of the base 721 (i.e., an edge of the base that faces away from the housing front side 20 when the tray is mounted to the housing) to define the L-shape for the rail. In this embodiment, an elongated cut-out section is provided in the mounting wall 722 that extends a lengthwise dimension of the mounting wall and defines a groove or track 724 that facilitates a coupling of a plurality of cable support posts 730 to the rail 720 and sliding movement of the posts along the rail via the track as described herein. The track 724 of the rail 720 can include one or more locations (such as location 725 as shown in FIG. 7B) having a larger dimension than other portions of the track to provide a locking location for a post as described herein.

Each post 730 of the system 700 also includes a lower or first support member 735 and an upper or second support member 740, where the second support member is secured to and located above the first support member and each member includes a support structure that supports a bundle of cables connected with ports 50 of the device 10 and facilitates routing of such cables to a desired location distanced from the device while ensuring a proper connection and minimizing bending (e.g., minimizing a bend radius) of the cables along their route thus ensuring optimal transmission of data by the cables to and from the networking device. In this embodiment, each support member 735, 740 has a generally rectangular shape formed by elongated legs that combine to form an open interior between the legs. In particular, each support member 735, 740 includes a lower or base leg 750 (where the base leg 750 extends transverse the lengthwise dimension of the rail when the post 730 is secured to the rail), a rear side leg 752 that connects with and extends upward from a lengthwise end of the base leg 750, a front side leg 754 that connects with and extends upward from the other lengthwise end of the base leg 750, and a top leg 756 that connects with the rear side leg 752 and extends toward but does not connect with the front side leg 754. In other words, the front side leg 754 for each support member 735, 740 has a shorter length than the rear side leg 752 such that a slight gap exists between the top leg 756 and front side leg 754. The top leg 756 of the lower or first support member 735 also defines the base leg 750 of the upper or second support member 740. In this configuration, when the support post 730 is coupled with the rail 720, each support member 735, 740 is dimensioned to receive and support a bundle of cables connected with ports 50 of the device 10, where the cables can be received between the legs 750, 752, 754, 756 of each support member 735, 740 by insertion at the gap between the front side leg 754 and the top leg 756 (where the gap provides an opening between the legs). In other words, the legs 750, 752, 754, 756 provide a partial enclosure, structural perimeter or frame surrounding an open space in which the cables are supported so as to maintain the bundle of cables within the support member when the cables are placed within such partial enclosure, frame or structural perimeter.

In the system 700, each post 730 secures to the mounting wall 722 of the rail 720 via the base leg 750 of its lower or first support member 735. A threaded bore can be provided at a front surface of the base leg 750 of the first support member 735 that is suitably dimensioned to receive a locking pin 760. The post 730 is coupled with the rail 720 with the base leg 750 of the first support member 735 engaging the base 721 of the rail and its base wall front surface facing the mounting wall 722. The locking pin 760 can be suitably dimensioned so as to be inserted through the track 724 of the mounting wall 722 and engaged (e.g., threaded engagement) with the bore of the base leg 750 for the first support member 735 so as to secure the post 730 with the rail 720. The post 730 can slide along the rail 720 via the locking pin 760 moving within the track 724. The post 730 can further be locked in position with the rail 720 at a location 725. For example, the pin 760 can include an enlarged portion that is larger in dimension than a dimension of the track but smaller in dimension than a dimension of the location 725. When the post 730 is moved along the rail 720 to position the pin 760 at the location 725, the pin 760 can be further inserted (e.g., by threaded engagement) into the bore of the first support member 735 such that the enlarged portion of the pin 760 extends at least partially into the track at location 725 (thus preventing further sliding movement of the post along the track).

As with the embodiment depicted in FIGS. 1-5, the system 700 of FIGS. 7A and 7B facilitates placement of posts 730 along the rail 720 at a number of different positions to maximize support and routing of bundles of cables secured to the ports 50, where a first bundle of cables (e.g., cables connected to an lower row of housing ports, where the first support members 735 of the posts 730 support and route the first bundle of cables) can be separated and segregated from a second bundle of cables (e.g., cables connected to an upper row of housing ports, where the second support members 740 of the posts 730 support and route the second bundle of cables).

Figure 8A:
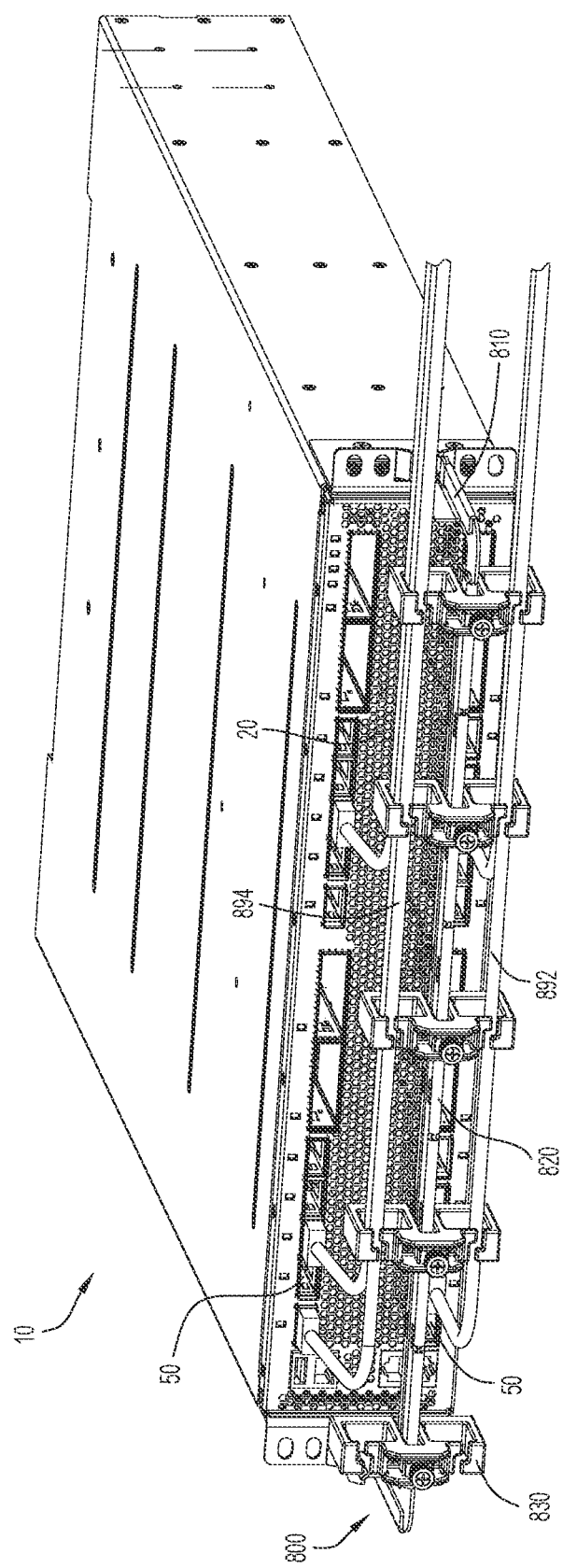
FIG. 8A depicts a front view in perspective of a networking device including a cable support and routing system to bundle groups of cables connected with the networking device in accordance with a further example embodiment.

A further example embodiment is depicted in FIGS. 8A-8C, where a cable support and routing system 800 is secured to a port side or front side 20 of a networking device 10 (where the device 10 includes a plurality of ports 50, such as network ports, provided in rows along the front side 20) in a manner similar to the system 100 depicted in FIGS. 1-5. The system 800 includes a generally U-shaped tray that includes a rail 820 secured to the housing front side 20 via a pair of brackets 810, where each bracket 810 is disposed at a lengthwise end of the rail 820. The rail 820 includes one or more notches 824 (e.g., a plurality of notches) disposed at varying locations along a front side or edge of the rail. A plurality of cable bundle support posts 830 are coupled with the rail 820 and can move in a sliding manner along the rail to certain locked positions as described herein.

Each post 830 includes a lower or first support member 835 and an upper or second support member 840, where the support members 835, 840 are secured to a central member 850 that couples the post to the rail 820 in a manner in which the first support member 835 is located below the rail and the second support member 840 is located above the rail. In addition, and as can be seen in FIGS. 8A-8C, each post 830 is generally symmetrical about an axis that is perpendicular the lengthwise dimension of the post such that the first and second support members can be interchanged (i.e., the post can be rotated 180° about its symmetrical axis and utilized in the same manner as described herein). Each support member 835, 840 has a generally rectangular shape formed by elongated legs that combine to form an open interior between the legs. In particular, each support member 835, 840 includes a base leg 842 that connects with a rear side of the central member 850, where each base leg 842 extends in a direction transverse the lengthwise dimension of the rail 820 (i.e., in a direction of the width of the rail). The base leg 842 of the first support member 835 is further separated from the base leg 842 of the second support member 840 a distance that defines a gap, where the gap is slightly larger than a thickness dimension of the rail 820. This permits the post 830 to be coupled with the rail 820 by insertion of the rail within the gap with the rear side of the central member 850 facing the rail such that the base leg 842 of each support member 835, 840 engages with an upper surface or lower surface of the rail (with first support member 835 being positioned below the rail and second support member 840 being positioned above the rail).

A rear side leg 844 connects with and extends transversely from each base leg 842 for each support member so as to form a portion of the rear side of the post 830 (i.e., a side that faces the port side or housing front side 20 of the device 10 when the post is coupled with the rail). A further side leg 846 is connected with and extends transversely from each rear side leg 844 in a direction away from the rear side of the post 830. The free end of each side leg 846 includes a short leg or short stub 847 that extends transversely away from the leg end and toward the central member 850. The central member 850 also includes a pair of short legs or short stubs 848 that extend toward the stubs 847. A gap exists between the free ends of each stub 847 and corresponding stub 848, and this gap permits entry of a cable into the open center of each support member 835, 840, where the open center for each support member is suitably dimensioned to receive a plurality or bundle of cables. In other words, the base leg 842, rear side leg 844, side leg 846 and stubs 847, 848 of each support member provide a partial enclosure, structural perimeter or frame surrounding an open space in which the cables are supported so as to maintain the bundle of cables within the support member when the cables are placed within such structural perimeter. Further, the free ends of each stub 847, 848 can be nonplanar (e.g., a cut-out or stepped configuration along the edge of each free end of stubs 847, 848, as shown in FIG. 8B) so as to define an opening to the partial enclosure, structural perimeter or frame that is non-linear, angled or irregular shaped. Such an opening can enhance retention of a bundle of cables (e.g., minimizing or preventing undesired escape of one or more cables from the interior of a support member without user guidance through the opening).

The support members 835, 840 have a dimension D that corresponds with the lengthwise dimension of legs 842, 846 (as shown in FIG. 8C) and that is slightly greater than the width dimension of the rail 820 such that, when the post 830 is slid over the rail with support member 835 positioned below the rail 820 and support member 840 positioned above the rail 820, a rear side of the post 830 (which is defined by the rear side legs 844 of the support members 835, 840) extends slightly beyond a rear edge of the rail 820. A rear cover plate 890 is provided that secures to the rear side of the post 830 at each rear side leg 844 of the support members 835, 840, and this cover plate 890 effectively secures the post 830 against rail 820 for sliding movement of the post along the rail.

The central member 850 includes a hollow center or cavity including a resilient member 880 (e.g., a leaf spring) disposed within the cavity. A locking pin 870 extends through a bore or channel that is defined through the central member 850 and is in communication with the cavity. The locking pin 870 includes a finger gripping head 872 disposed outside of the bore and cavity of the central member 850 at a front side of the post 830. The finger gripping head 872 is dimensioned so that it cannot enter into the bore at the post front side. A shaft or plunger 874 is connected with the head 872 and extends through the bore and cavity and further partially into the gap defined between the base legs 842 of the support members 835, 840. The plunger 874 includes a locking head 876 connected at its free end that is disposed within the gap between the support members 835, 840. The locking head 876 is dimensioned so as to fit within the one or more notches 824 disposed along the front side or edge of the rail 820.

Within the cavity of the central member 850, the resilient member 880 is coupled with the plunger 874 so as to bias the plunger in a direction F as shown in FIG. 8C, which is a direction toward the rail 820 when the post 830 is coupled with the rail 820. When the post 830 is coupled with the rail 820 (as shown in FIGS. 8A and 8B), the locking head 876 engages a front side of the rail 820 due to the bias of the resilient member 880. The post 830 can still freely move in a sliding manner along the rail (i.e., in a lengthwise dimension of the rail) with the plunger 874 being biased in this manner. However, when the post 830 is positioned along the rail 820 such that the locking head 876 is aligned with a notch 824 at the front side or edge of the rail 820, the bias of the resilient member 880 pushed the plunger 874 further in the direction F toward the rail so as to lock the locking head 876 within the notch 824. This effectively locks the post 830 in a fixed position on the rail. This locking or fixed position can be overcome by pulling the locking pin 870 (by gripping the head 872) in a direction away from the central member 850 (i.e., in a direction opposing direction F) and against the bias of the resilient member 880 so as to release the locking head 876 from the notch 824 and sliding the post 830 to another position along the rail 820. After moving the post 830 to a position in which the locking head 876 is no longer aligned with the notch 824, the finger gripping head 872 can be released causing movement of the plunger 874 back in the direction F (due to the bias of the resilient member 880) so as to push the locking head 876 back against the rail 820. The post 830 can then be moved in a sliding manner to another position along the rail 820 until the locking head 876 reaches and aligns with another notch 824.

As previously noted, when the post 830 is coupled with the rail 820, a first support member 835 is positioned below the rail while a second support member 840 is positioned above the rail. This system configuration is provided for embodiments in which rows of ports 50 on a device 10 are separated a certain distance from each other. As depicted in FIG. 8A, the system configuration permits a bundle of cables 892 connected with a first row of ports 50 (e.g., network ports) to be supported and routed by the lower or first support members 835 of the posts 830 positioned below the rail 820, while another bundle of cables 894 connected with a second row of ports 50 (e.g., network ports) located a certain distance above the first row of ports 50 can be supported and routed by the upper or second support members 840 of the posts 830 positioned above the rail 820.

FIGS. 9A-9C depict a networking device including a cable support and routing system to bundle groups of cables connected with the networking device in accordance with an example embodiment. In some configurations, a networking device 910 may include, in, e.g., a location 920, a modular line card 921 (a close up of which is shown in FIG. 9B) which might provide, in total, eight QSFP28 ports, four QSFP-DD ports, and two CFP2 ports. More than one line card 921 may be disposed in networking device 910, as shown in FIG. 9A. FIG. 9C shows a tray 960 having two levels 961, 962, offset from each other, with lower level 962 being slightly lower than level 961. The lower level 962 allows easier access to, e.g., the CFP2 ports of the modular line card 921. FIG. 9C also shows a support post 1000 configured to support cables (shown in FIGS. 10B, 14A and 14B) that are plugged into the ports of the modular line card 921. As will be explained in more detail below, support post 1000 may be configured to be angled with respect to, e.g., a longitudinal axis (see, e.g., FIG. 12B, 1250) of the tray 960 such that cables attached to the several ports of the networking device 910 can be more easily routed either to the left or right of the networking device 910, and also ensure an appropriate bend radius for the individual cables. Support post 1000 may also be configured such that it can be rotated away from tray 960, to provide still more access to the ports of the modular line card 92.

Figure 10B:
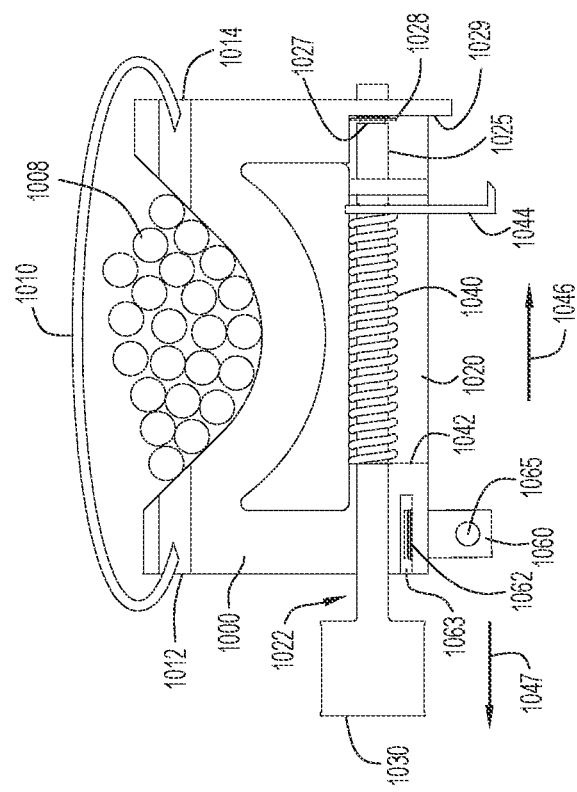
FIGS. 10A and 10B depict, respectively, a perspective view and a cross sectional view of a support post in accordance with an example embodiment.
Figure 10A:
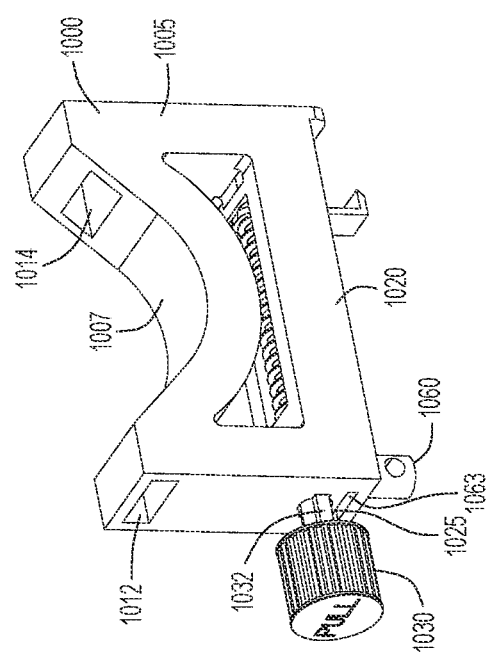

FIGS. 10A and 10B depict, respectively, a perspective view and a cross sectional view of support post 1000 in accordance with an example embodiment. Support post 1000 includes a body 1005 having a cable supporting section 1007, which, as shown, may be curved or concave to receive fiber optic or copper cables 1008. Cables 1008 may be secured with a hook and loop fastener 1010 that is secured to body 1005 via openings 1012 and 1014. The body 1005 includes a base 1020 that houses locking pin 1022 including a shaft 1025 that, at a proximal end, includes a finger gripping head 1030 and, at a distal end, includes a groove 1027 that is configured to receive a C-clip 1028 that secures the shaft 1025 inside base 1020 against a distal abutment 1029. In an embodiment, shaft 1025 may include a key 1032 that may be a groove or protrusion that corresponds to a matching protrusion or groove (not shown) on an internal surface of base 1020 that prevents the shaft 1025 from rotating. A bias member or spring 1040 is disposed on the shaft 1025 between a proximal abutment 1042, at a proximal end, and a latch 1044, which is disposed towards a distal end of the shaft 1025. As will be appreciated by those skilled in the art, the spring 1040 biases the shaft 1025, and thus latch 1044 connected thereto, in a translation direction 1046. On the other hand, a user can pull on finger gripping head 1030 in a direction 1047 which will cause latch 1044 to also move in the same direction 1047. As will be explained with respect to FIGS. 12A and 12B, latch 1044 is configured to engage with a corresponding opening, e.g., 1210, 1212, 1214, to lock support post 1000 in a particular position on tray 960.

As further shown in FIGS. 10A and 10B, support post 1000 includes a rotating pin 1060 that includes a C-clip 1062 that engages with a groove (not shown) on rotating pin 1060. Base 1020 may include a slot 1063 through which C-clip 1062 can be passed to secure rotating pin 1060 to base 1020. Rotating pin 1060 also includes a cylindrical passageway 1065 that extends through rotating pin 1060.

Figure 11B:
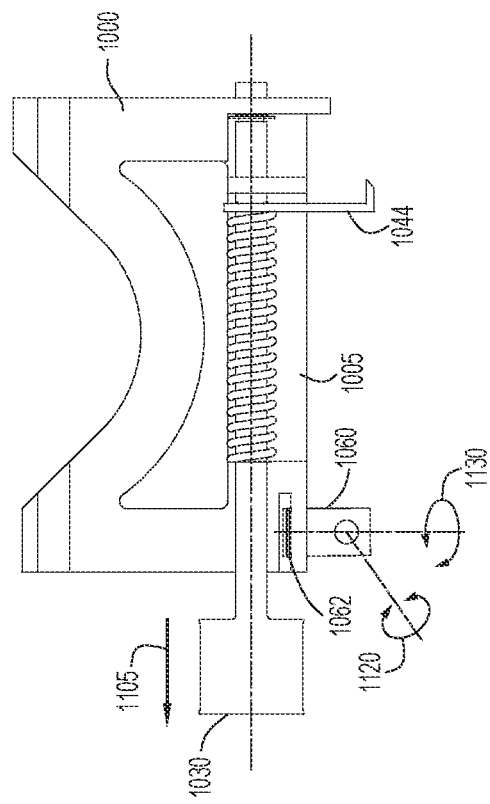
FIGS. 11A and 11B illustrate the degree of freedom provided to the support post in accordance with an example embodiment.
Figure 11A:
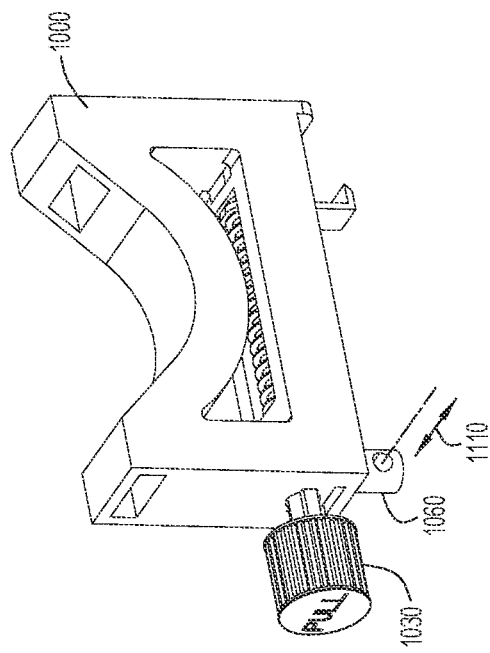

FIGS. 11A and 11B illustrate the degree of freedom provided to support post 1000 via rotating pin 1060, in accordance with an example embodiment. As shown, in FIG. 11A (and further shown in FIG. 17B), support post 1000, when mounted on a slide shaft 1710 via rotating pin 1060, can be moved in directions depicted by double headed arrow 1110. Rotating pin 1060 also allows rotation 1120 around slide shaft 1710 (or guide shaft 1230 (see FIG. 12B)) and rotation 1130 enabled by the rotative coupling of rotating pin 1060 to body 1005 via C-clip 1062. In an embodiment, before any of the foregoing movements may be imparted, finger gripping head 1030 is first pulled away from body 1005 in a direction 1105, causing latch to disengage from an opening, e.g., 1210, 1212, 1214, once body 1005 is lifted slightly up and away from such opening as a result of rotation 1120.

Figure 12A:
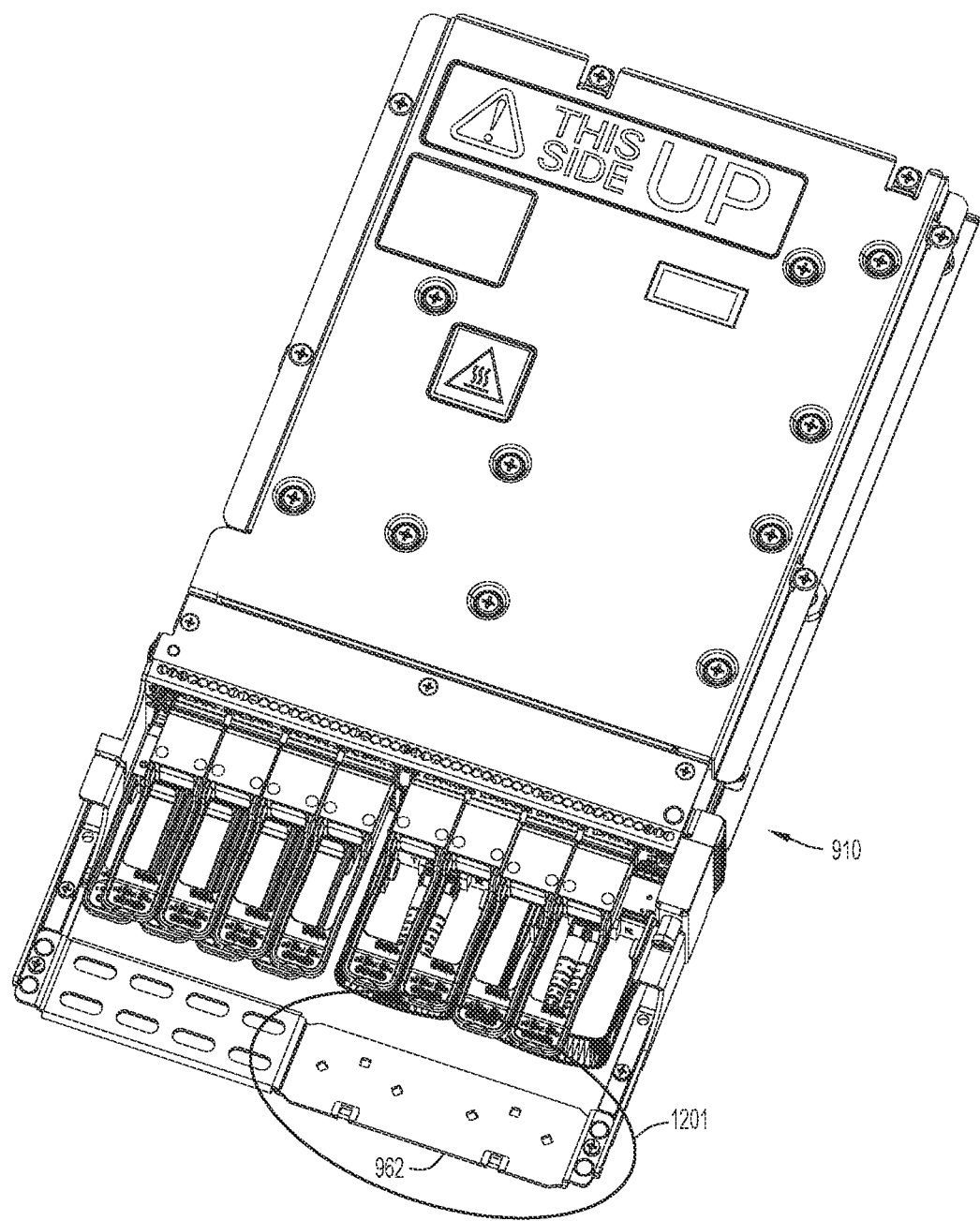

FIGS. 12A and 12B depict a tray on which the support post is disposed in accordance with an example embodiment. Specifically, FIG. 12B is a close up depiction of area 1201 of FIG. 12A. In this embodiment, lower level 962 of tray 960 includes openings 1210, 1212, 1214, which are oriented such that support post 1000 can be in one of three different positions to accommodate cables connected to the several ports. That is, openings 1210, 1212, 1214 are arranged to accept latch 1044 of support post 1000 depending on the orientation of support post 1000 on lower level 962 of tray 960. In one implementation, openings 1210, 1212, 1214 may be offset from each other by 45 degrees. However, those skilled in the art will appreciate that other offset angles may be used.

In the embodiment of FIG. 12B, guide shaft 1230 is secured to, e.g., a U-shaped connector block 1240, which may be press fit or riveted into a notch 965 in lower level 962 of tray 960. In one possible implementation, guide shaft 1230 and U-shaped connector block 1240 may already be connected to rotating pin 1060, and the entire resulting assembly (including support post 1000) may be press fit into notch 965. In the embodiment shown in FIG. 12B, the guide shaft 1230 has a length substantially equivalent to a diameter of the rotating pin 1060.

A bracket 1260 may be configurable to allow for different lengths that are suitable for ETSI or ANSI deployments.

Figure 13A:
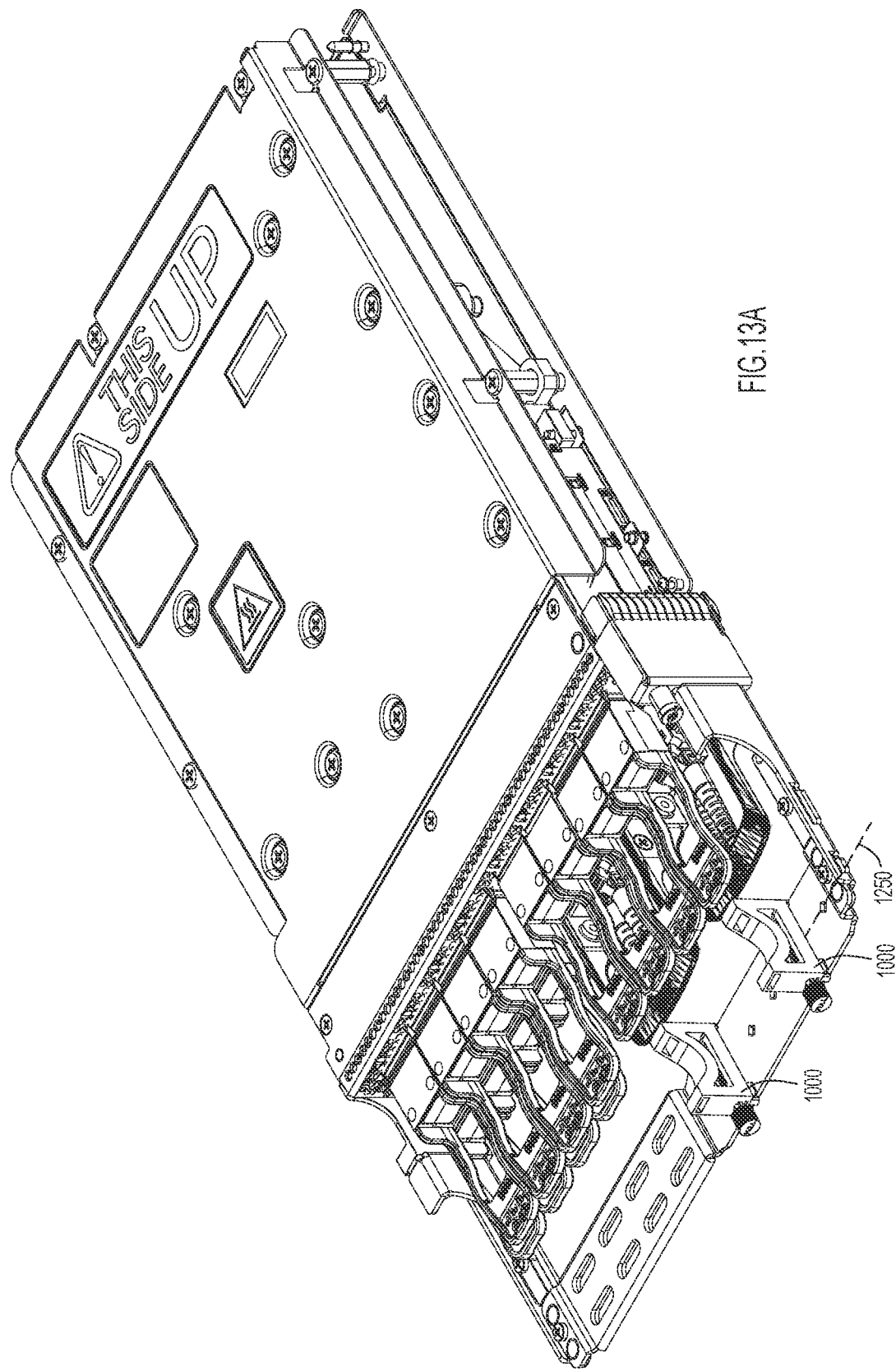
FIGS. 13A-13C depict different orientations of the support post on the tray in accordance with an example embodiment.
Figure 13B:
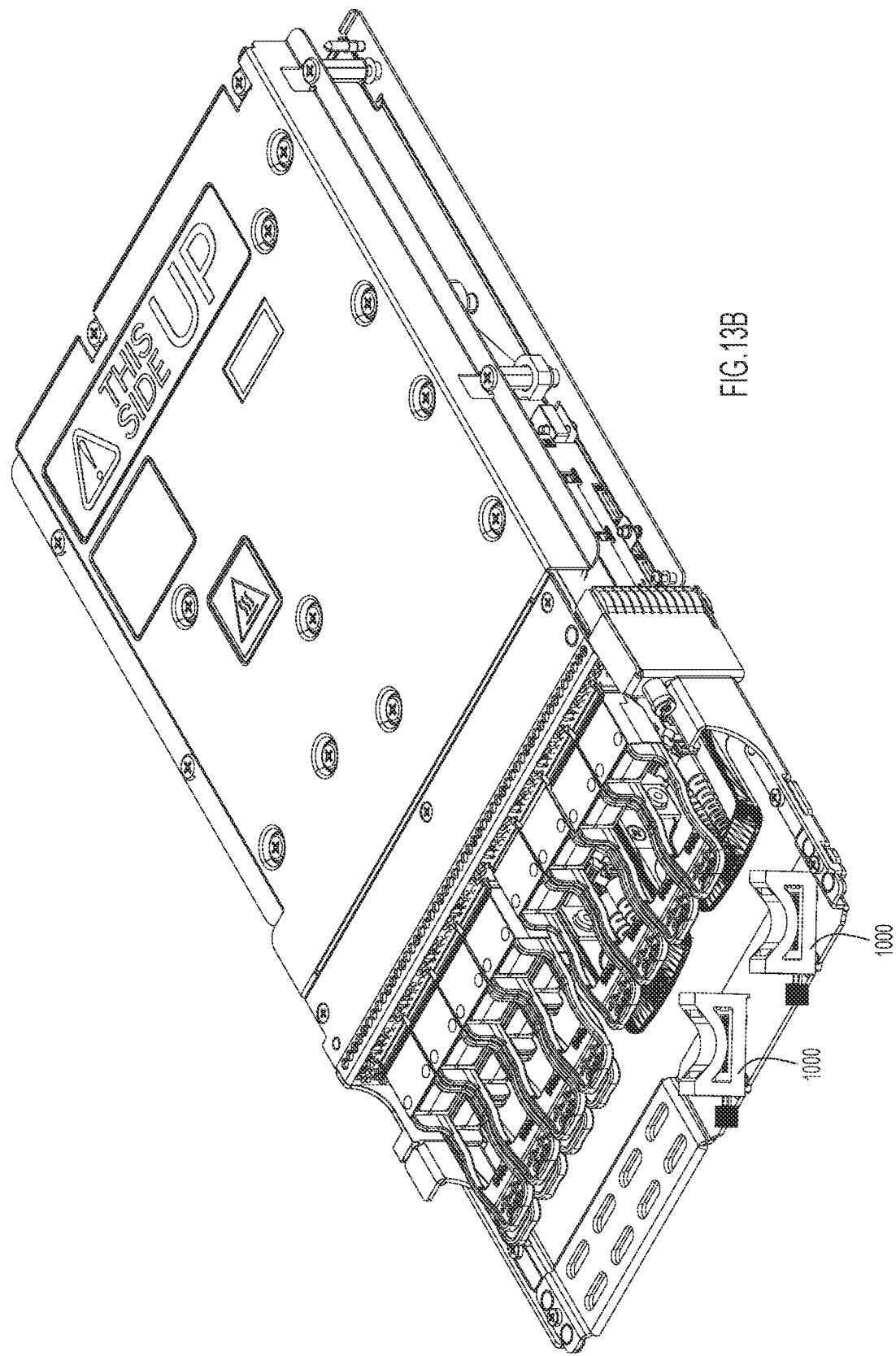
Figure 13C:
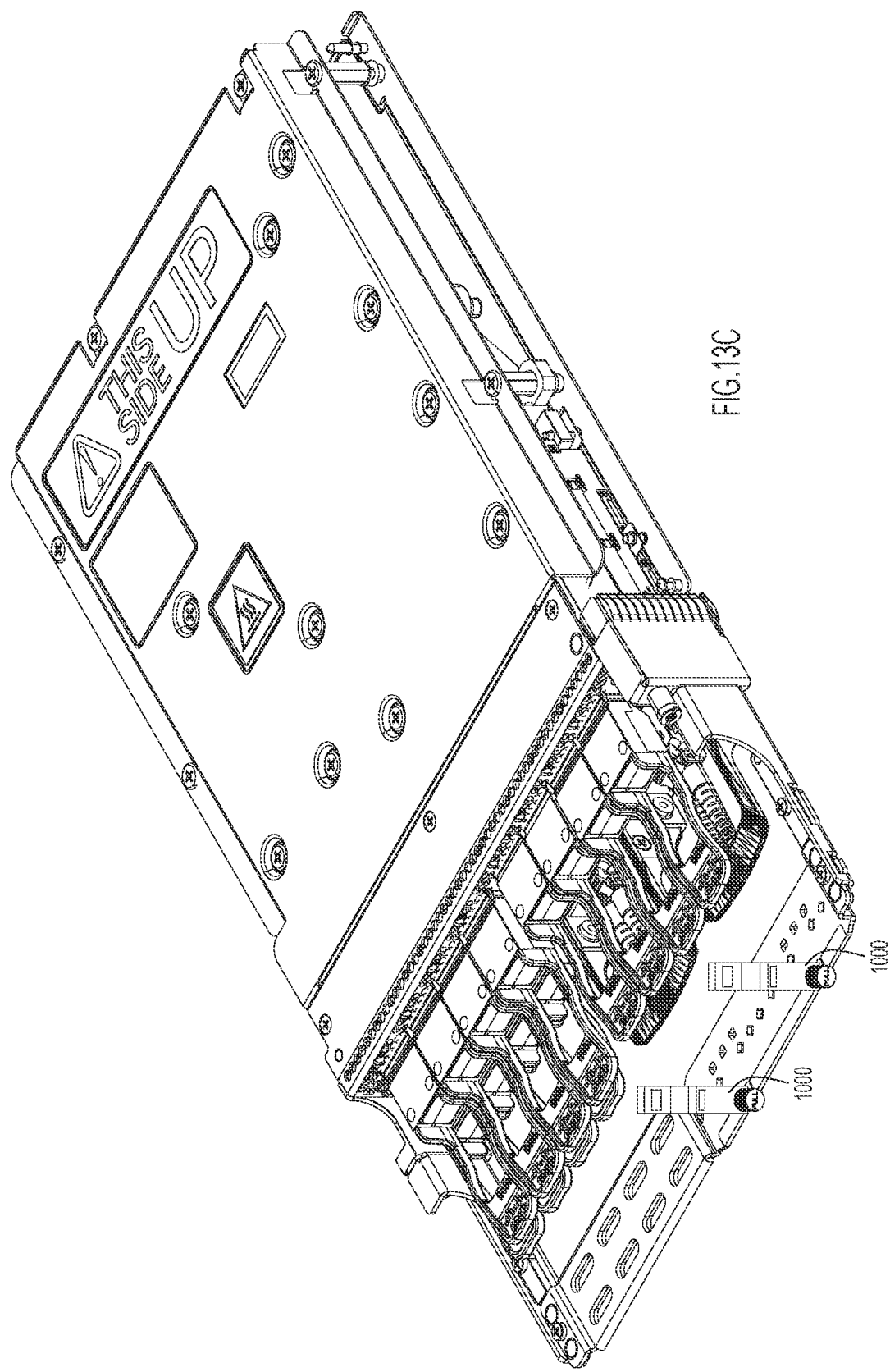

FIGS. 13A-13C depict different orientations or positions of the support post 1000 on the tray 960 in accordance with an example embodiment. In a first configuration shown in FIG. 13A, support post 1000 is arranged to be perpendicular to longitudinal axis 1250 of the tray 960. In FIG. 13B, support post 1000 is arranged to be offset 45 degrees from a perpendicular of longitudinal axis 1250 (and towards the right). In FIG. 13C, support post 1000 is arranged to be offset 45 degrees from the perpendicular of longitudinal axis 1250 (and towards the left).

Figure 14A:
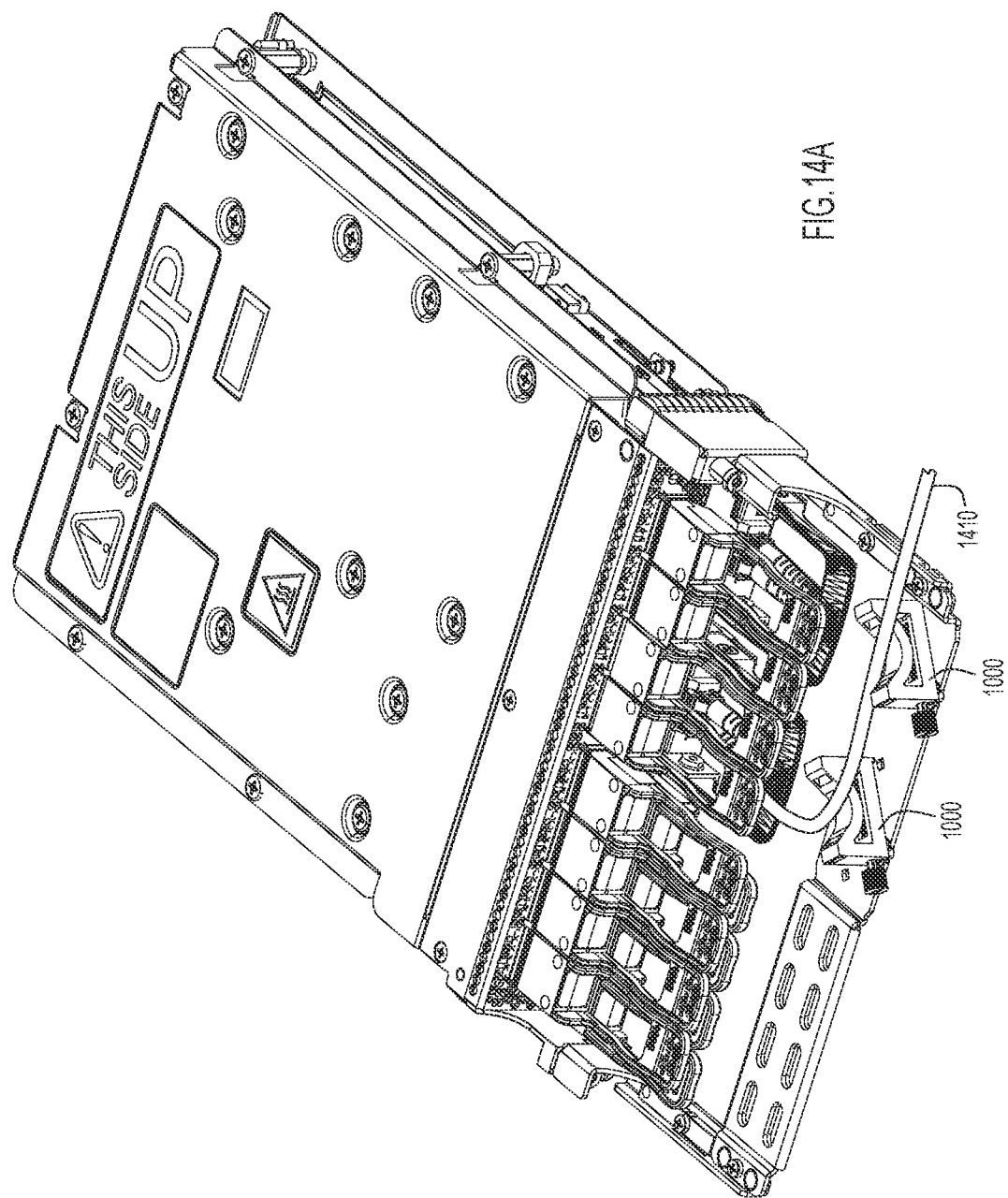
FIGS. 14A and 14B depict how optical fibers may be managed by the support post in accordance with an example embodiment.
Figure 14B:
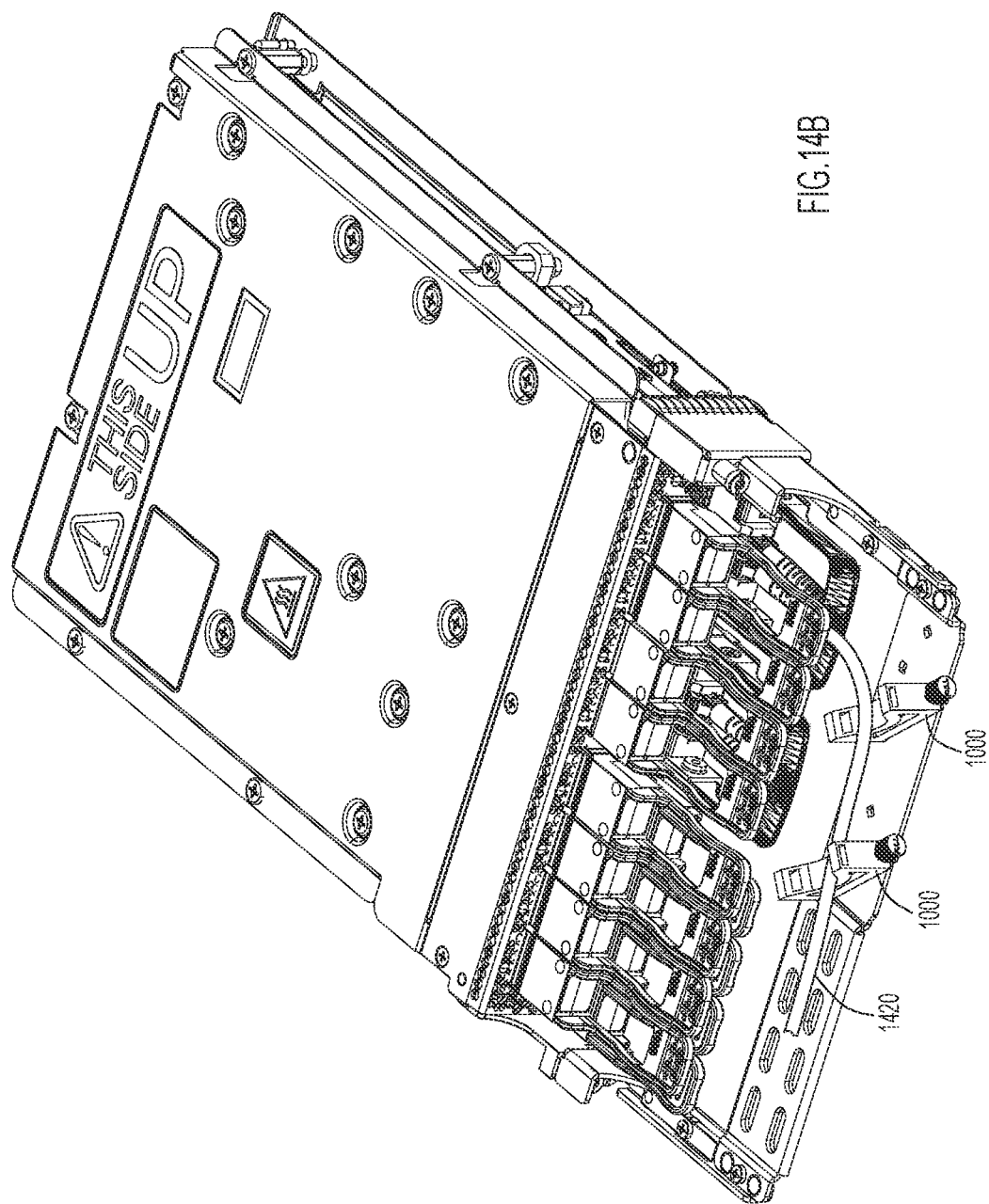

FIGS. 14A and 14B depict how cables or optical fibers may be managed by the support post 1000 in accordance with an example embodiment. As shown, a cable 1410 in FIG. 14A exits to the right and each support post 1000 is oriented to the right to better accommodate that configuration and bend radius. Similarly, a cable 1420 in FIG. 14B exits to the left and each support post 1000 is oriented to the left to better accommodate that configuration and bend radius.

Figure 15B:
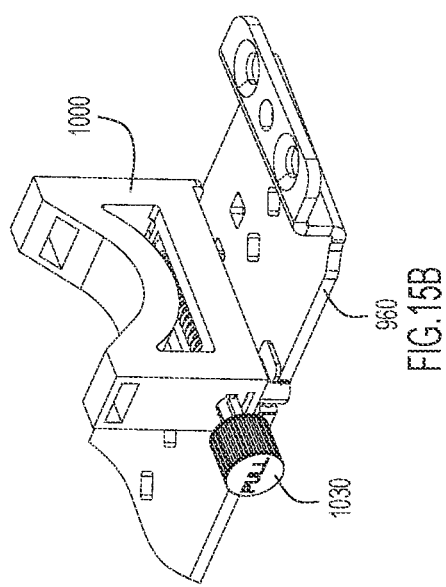
FIGS. 15A-15E depict how the support post is rotated away from the tray in accordance with an example embodiment.
Figure 15D:
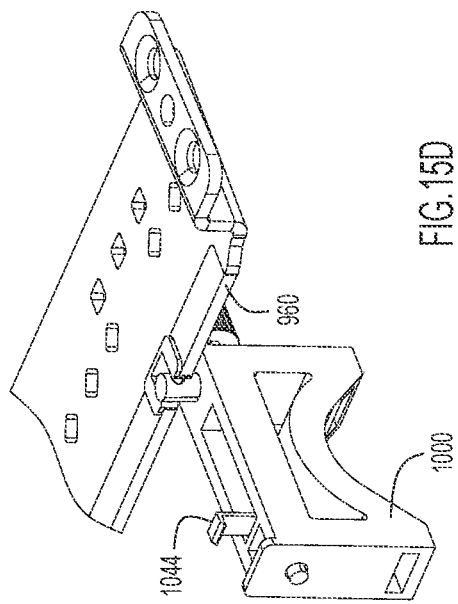
Figure 15A:
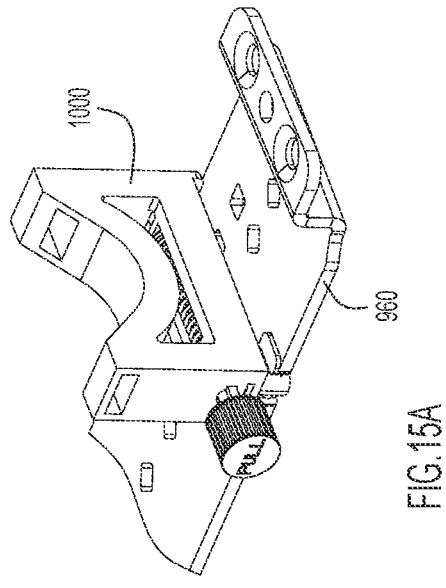
Figure 15C:
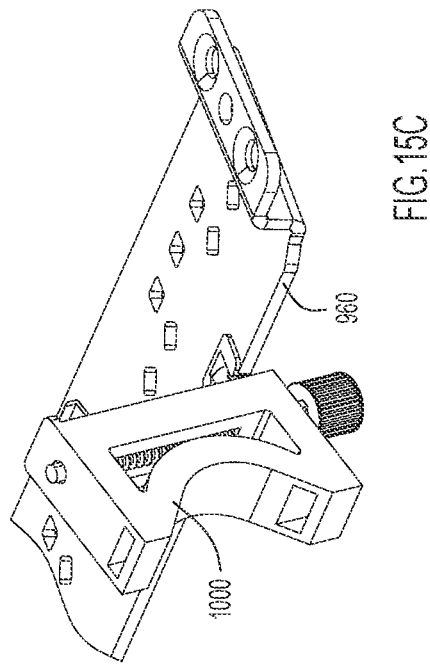

FIGS. 15A-15E depict how the support post 1000 is rotated away from the tray, in accordance with an example embodiment. In FIG. 15A, support post 1000 is secured to tray 960 (e.g., lower level 962 thereof) via latch 1044 in one of the openings 1210, 1212, 1214. FIG. 15B shows finger gripping head 1030 being pulled away from support post 1000 thus releasing latch 1044 from the tray 960. At this point, and as shown by FIG. 15C, support post 1000 can be rotated around, e.g., guide shaft 1230 away from tray 960.

Figure 15E:
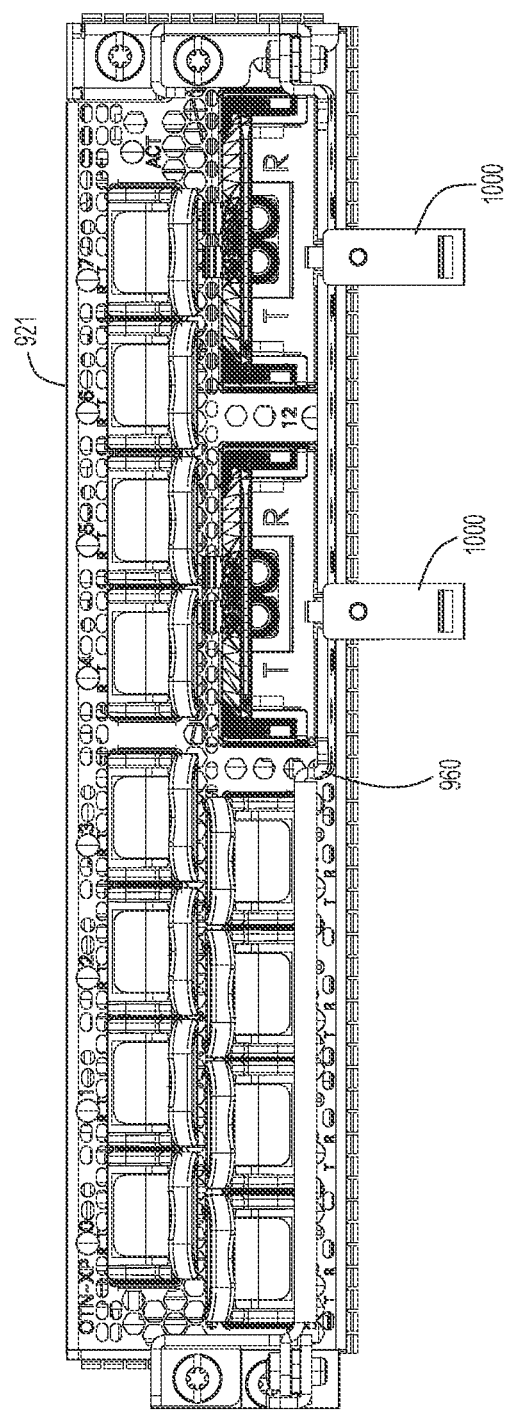

FIG. 15D shows support post 1000 in an extreme rotated position, which provides full access to the ports of the several line cards, as shown in FIG. 15E. In the position of FIGS. 15D and 15E it is possible to perform online insertion and removal of a given module free and clear of a support post 1000.

FIGS. 16A-16D show different possible configurations of the support post in accordance with an example embodiment. FIG. 16A depicts a support post 1610 similar to that shown, e.g., in FIG. 10A with a cable supporting section 1007, which is concave in the embodiment shown. FIG. 16B depicts a support post 1620 that is substantially C-shaped and which can receive cables through a relatively small opening 1621, thus precluding, for example, the need for hook and loop fasteners. FIG. 16C depicts a support post 1630 that includes two concave cable supporting sections 1631, 1632 substantially stacked one on top of the other. FIG. 16D depicts yet another support post 1640 that is substantially E-shaped. Each of the foregoing embodiments depicted in FIGS. 16A-16D includes the several components described herein to enable the supports posts 1610, 1620, 1630 and 1640 to have the same degrees of movement as support post 1000 described above. It is also noted that different mixes of support posts 1610, 1620, 1630, 1640 can be selected for a given application.

Figure 17A:
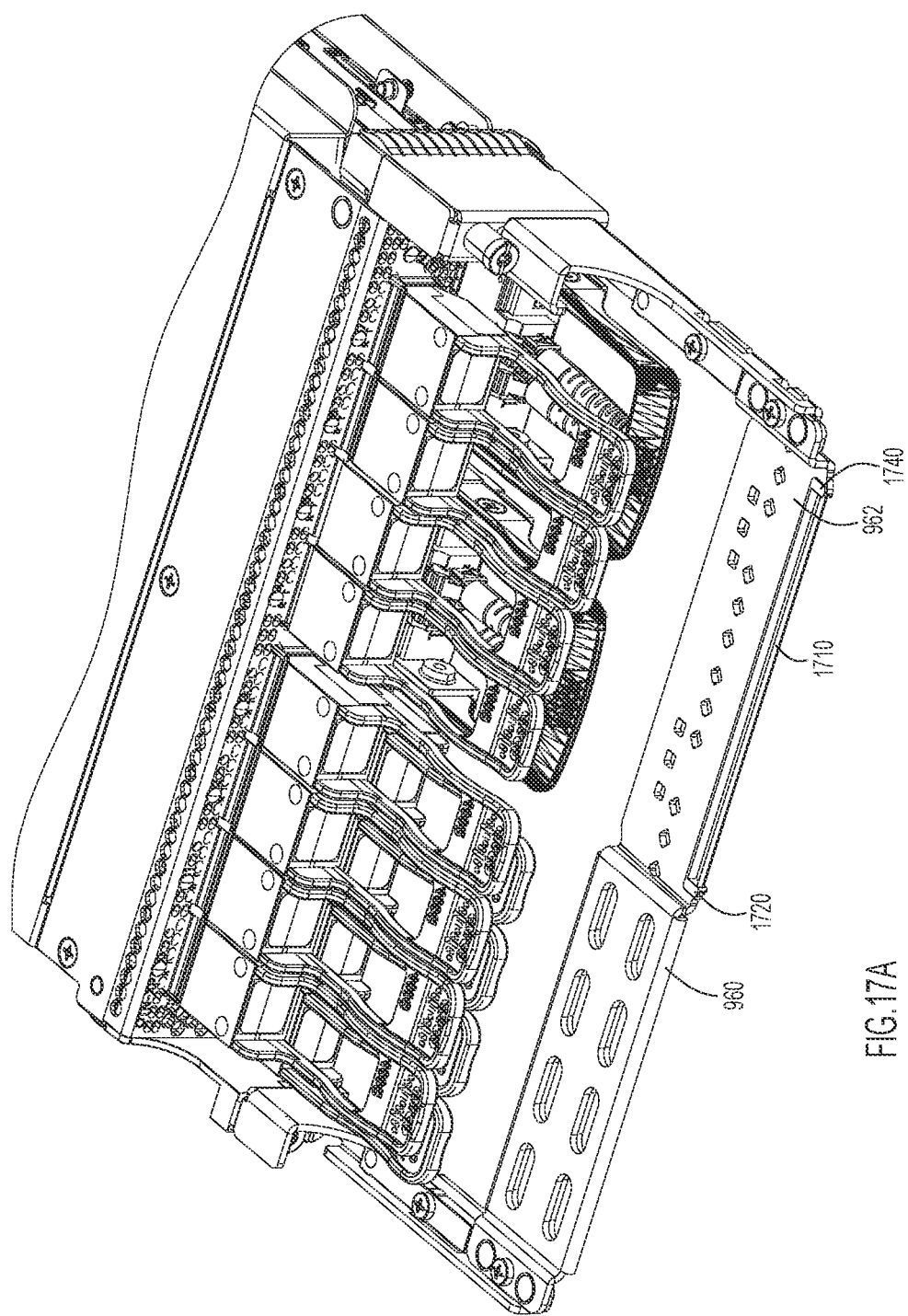
FIGS. 17A and 17B depict a tray having a slide shaft that accommodates the support post and allows the support post to be moved across the tray in accordance with an example embodiment.
Figure 17B:
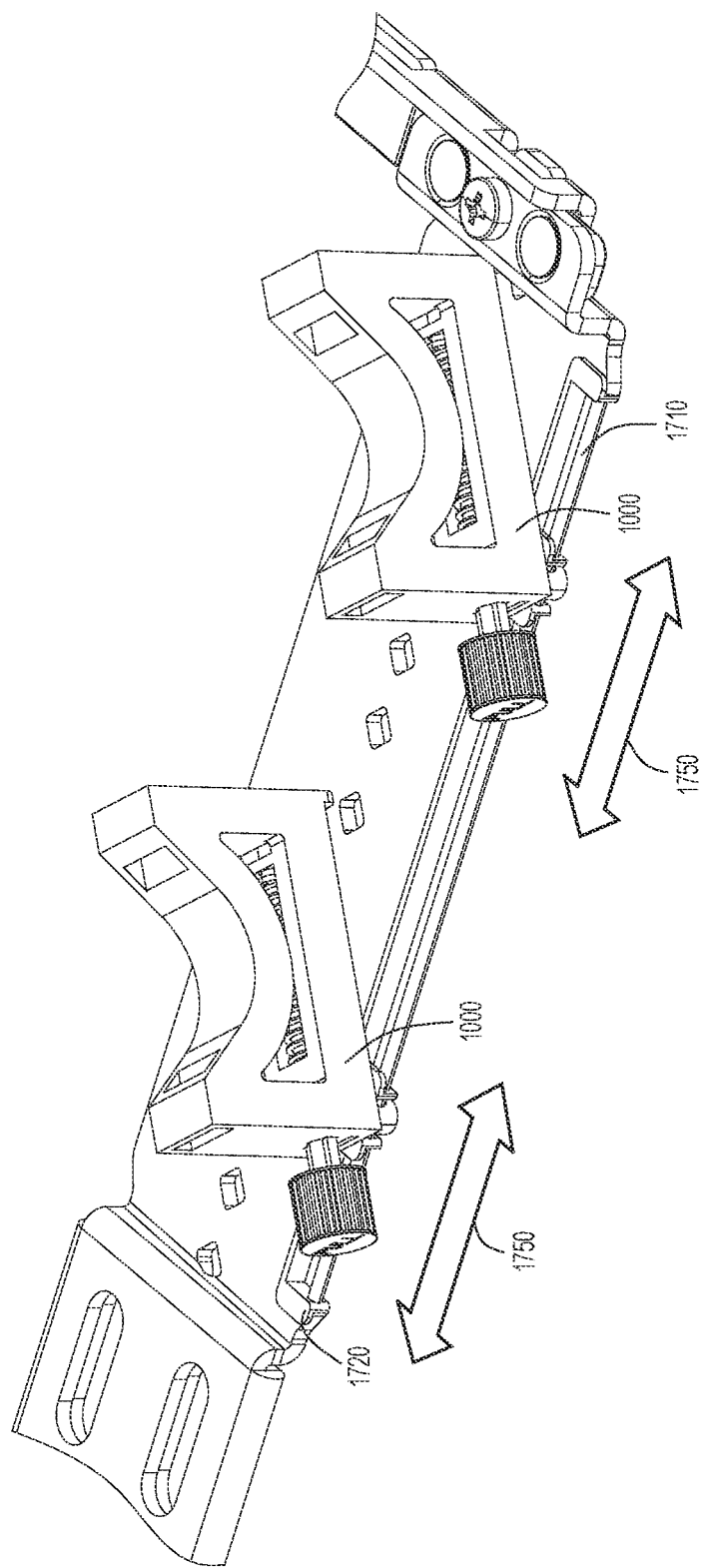
Figure 18:
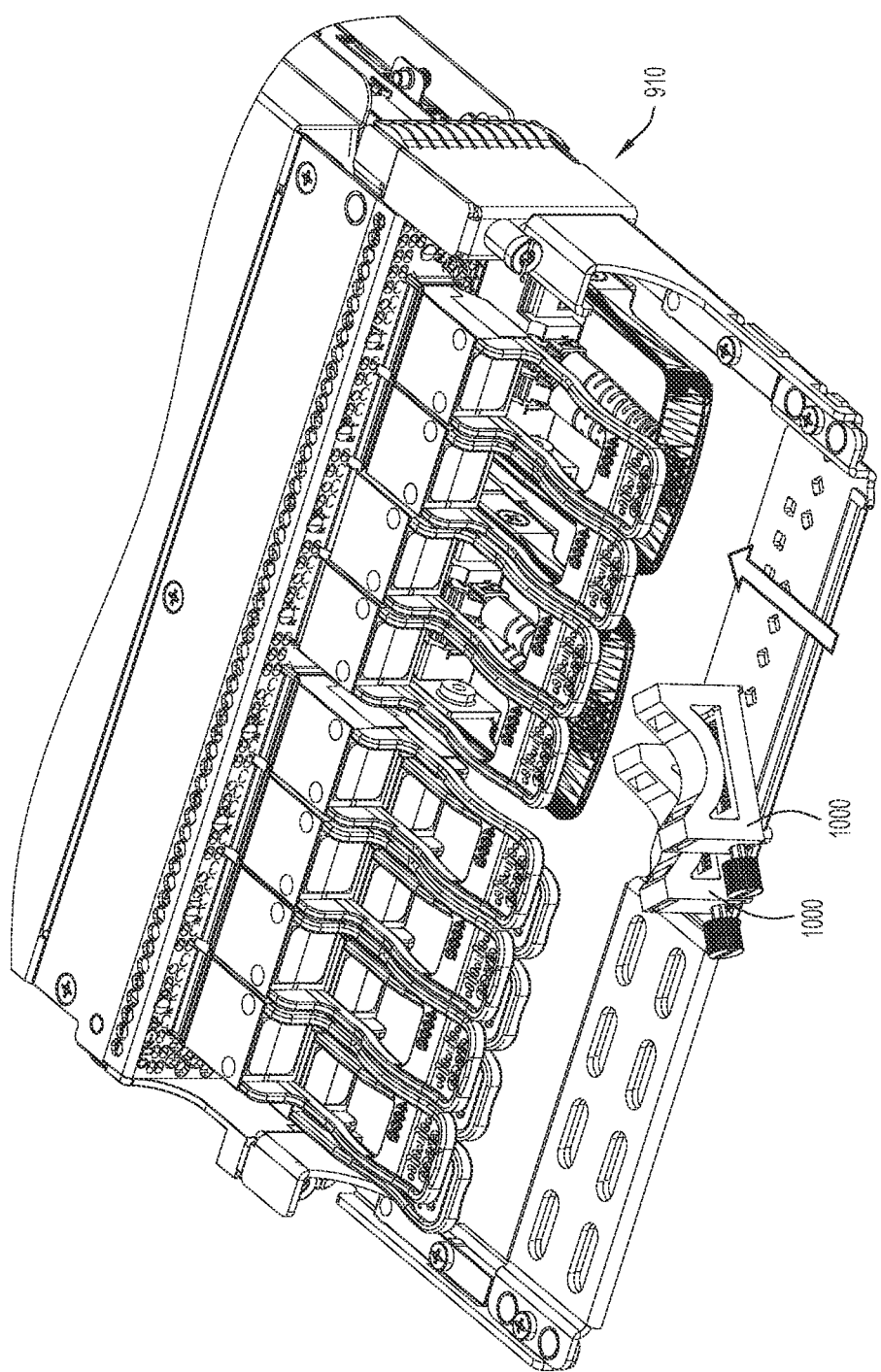
FIG. 18 depicts supports posts moved to one side of a tray in accordance with an example embodiment.

FIGS. 17A and 17B depict a tray having a slide shaft that accommodates the support post and allows the support post to be moved across the tray in accordance with an example embodiment. FIG. 17A shows slide shaft 1710 that is similar to guide shaft 1230, but extends substantially the length of, e.g., the lower level 962 of tray 960. A U-shaped connector block 1720, which is press fit or riveted into a notch 1740 in lower level 962 of tray 960. In one possible implementation, slide shaft 1710 and U-shaped connector block 1720 may already be connected to a respective rotating pin 1060 of the support post 1000, and the entire resulting assembly (including support post 1000) may be press fit into notch 1740. Once each support post 1000 is so configured they can be moved in the directions indicated by arrows 1750. FIG. 18 depicts supports posts 1000 moved to one side of the lower level 962 of tray 960 to facilitate access to the several ports exposed by the networking device 910.

In sum, an apparatus includes a tray; a shaft connected to the tray; a bracket that secures the tray to a networking device such that the tray is distanced from a surface of the networking device; and a support post coupled to the tray via the shaft, the support post including: a rotating pin having a cylindrical passage through which the shaft passes, the rotating pin being coupled to the support post to allow the support post to rotate about the rotating pin and about the shaft; and a locking pin having a latch that is configured to engage with a corresponding opening on the tray to secure the support post to the tray.

In an embodiment, the tray includes a first opening and a second opening, different from the first opening, with which the latch is configured to engage.

In an embodiment, the first opening and the second opening are offset from each other by a predetermined angle. The predetermined angle may be 45 degrees.

In one implementation, the locking pin may be biased with a spring that forces the latch to lock within the corresponding opening on the tray.

In an embodiment, the shaft may be connected to the tray via a U-shaped connector block. The U-shaped connector block may be disposed in a notch in the tray.

In an embodiment, the shaft is a guide shaft having a length substantially equivalent to a diameter of the rotating pin. The shaft may be a slide shaft having a length that extends along at least half the length of the tray.

In one embodiment, the support post is configured to rotate about the rotating pin to accommodate cables leaving the networking device to a right side of the networking device or to a left side of the networking device.

In another embodiment, a networking device is provided and includes a housing including electronic components, wherein a plurality of ports are provided along a port side of the housing; a tray; a shaft connected to the tray; a bracket that secures the tray to the housing such that the tray is distanced from a surface of the housing; and a plurality of support posts coupled to the tray via the shaft, wherein each support post in the plurality of support posts includes: a rotating pin having a cylindrical passage through which the shaft passes, the rotating pin being coupled to the support post to allow the support post to rotate about the rotating pin and about the shaft; and a locking pin having a latch that is configured to engage with a corresponding opening on the tray.

In one implementation, the plurality of support posts may be oriented in a same direction on the tray.

In another implementation, the plurality of support posts may be oriented perpendicular to a longitudinal axis of the tray. The plurality of support posts may also, or alternatively, be oriented at a predetermined angle from a perpendicular of a longitudinal axis of the tray.

In an embodiment, the plurality of support posts is configured to accommodate cables leaving the networking device to a right side of the networking device or to a left side of the networking device.

In still another embodiment, a method is provided and includes rotating a support post, connected to a tray via a shaft, from a first position in which the support post accommodates cables leaving a networking device, to a second position that provides access to ports of the networking device; attaching the cables to the ports of the networking device; rotating the support post from the second position to the first position; and routing the cables to lay on the support post.

The method may further include angling the support post on the tray to accommodate the cables leaving the networking device to a right side of the networking device or to a left side of the networking device.

The method may also include disengaging a latch that engages with the tray to enable the step of rotating the support post away from the first position.

The method may also include pulling a spring biased locking pin to disengage the latch that engages with the tray.

The method may also include sliding the support post from one end of the tray to another end of the tray.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
a tray;
a shaft connected to the tray;
a bracket that secures the tray to a networking device such that the tray is distanced from a surface of the networking device; and
a support post coupled to the tray via the shaft, the support post including:
a rotating pin having a cylindrical passage through which the shaft passes, the rotating pin being coupled to the support post to allow the support post to rotate about the rotating pin and about the shaft; and
a locking pin having a latch that is configured to engage with a corresponding opening on the tray to secure the support post to the tray.

2. The apparatus of claim 1, wherein the tray includes a first opening and a second opening, different from the first opening, with which the latch is configured to engage.

3. The apparatus of claim 2, wherein the first opening and the second opening are offset from each other by a predetermined angle.

4. The apparatus of claim 3, wherein the predetermined angle is 45 degrees.

5. The apparatus of claim 1, wherein the locking pin is biased with a spring that forces the latch to lock within the corresponding opening on the tray.

6. The apparatus of claim 1, wherein the shaft is connected to the tray via a U-shaped connector block.

7. The apparatus of claim 6, wherein the U-shaped connector block is disposed in a notch in the tray.

8. The apparatus of claim 1, wherein the shaft is a guide shaft having a length substantially equivalent to a diameter of the rotating pin.

9. The apparatus of claim 1, wherein the shaft is a slide shaft having a length that extends along at least half the length of the tray.

10. The apparatus of claim 1, wherein the support post is configured to rotate about the rotating pin to accommodate cables leaving the networking device to a right side of the networking device or to a left side of the networking device.

11. A networking device comprising:
a housing including electronic components, wherein a plurality of ports are provided along a port side of the housing;
a tray;
a shaft connected to the tray;
a bracket that secures the tray to the housing such that the tray is distanced from a surface of the housing; and
a plurality of support posts coupled to the tray via the shaft, wherein each support post in the plurality of support posts includes:
a rotating pin having a cylindrical passage through which the shaft passes, the rotating pin being coupled to the support post to allow the support post to rotate about the rotating pin and about the shaft; and
a locking pin having a latch that is configured to engage with a corresponding opening on the tray.

12. The networking device of claim 11, wherein the plurality of support posts is oriented in a same direction on the tray.

13. The networking device of claim 11, wherein the plurality of support posts is oriented perpendicular to a longitudinal axis of the tray.

14. The networking device of claim 11, wherein the plurality of support posts is oriented at a predetermined angle from a perpendicular of a longitudinal axis of the tray.

15. The networking device of claim 11, wherein the plurality of support posts is configured to accommodate cables leaving the networking device to a right side of the networking device or to a left side of the networking device.

16. A method comprising:
rotating a support post, connected to a tray via a shaft that passes through a rotating pin, which enables rotation of the support post around two axes, from a first position in which the support post accommodates cables leaving a networking device, to a second position that provides access to ports of the networking device;
attaching the cables to the ports of the networking device;
rotating the support post from the second position to the first position; and
routing the cables to lay on the support post.

17. The method of claim 16, further comprising:
angling, via the rotating pin, the support post on the tray to accommodate the cables leaving the networking device to a right side of the networking device or to a left side of the networking device.

18. The method of claim 16, further comprising: disengaging a latch that engages with the tray to enable a step of rotating the support post away from the first position.

19. The method of claim 18, further comprising:
pulling a spring biased locking pin to disengage the latch that engages with the tray.

20. The method of claim 16, further comprising:
sliding the support post along the shaft from a first location on the tray to a second location on the tray.

* * * * *